US012810919B2

(12) United States Patent
Li et al.

(10) Patent No.: US 12,810,919 B2
(45) Date of Patent: Nov. 24, 2026

(54) MEMORY AND OPERATION METHOD THEREOF, AND MEMORY SYSTEM

(71) Applicant: Yangtze Memory Technologies Co., Ltd., Wuhan (CN)

(72) Inventors: Danyang Li, Wuhan (CN); Yu Wang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 132 days.

(21) Appl. No.: 18/892,306

(22) Filed: Sep. 20, 2024

(65) Prior Publication Data

US 2025/0336436 A1 Oct. 30, 2025

(30) Foreign Application Priority Data

Apr. 30, 2024 (CN) ......................... 202410551178.9

(51) Int. Cl.

| | |
|---|---|
| ***G11C 11/408*** | (2006.01) |
| ***G11C 11/406*** | (2006.01) |
| ***G11C 11/4074*** | (2006.01) |
| ***G11C 11/4076*** | (2006.01) |

(52) U.S. Cl.

CPC ........ *G11C 11/4085* (2013.01); *G11C 11/406* (2013.01); *G11C 11/4074* (2013.01); *G11C 11/4076* (2013.01)

(58) Field of Classification Search

CPC .............. G11C 11/4085; G11C 11/406; G11C 11/4074; G11C 11/4076

USPC ..................................................... 365/230.06

See application file for complete search history.

(56) References Cited

U.S. PATENT DOCUMENTS

| | | | | |
|---|---|---|---|---|
| 5,654,913 A * | 8/1997 | Fukushima | G11C 11/4074 365/228 |
| 2010/0046313 A1* | 2/2010 | Lee | G11C 11/4085 365/230.06 |
| 2020/0294572 A1* | 9/2020 | Hou | G11C 11/40615 |

* cited by examiner

*Primary Examiner* — Alexander Sofocleous
*Assistant Examiner* — Duy H Luong
(74) *Attorney, Agent, or Firm* — Conley Rose, P.C.

(57) ABSTRACT

Examples of the present disclosure provide memory, an operation method thereof, and a memory system. One example of the memory includes: a plurality of word lines, a plurality of memory cells coupled with each word line, and a peripheral circuit coupled to the plurality of word lines and configured to: during a refresh operation on a memory cell coupled with at least one selected word line in the plurality of word lines, apply a first voltage to an unselected word line adjacent to the selected word line by turning on a first voltage transmission circuit and at least partially turning off a second voltage transmission circuit.

18 Claims, 12 Drawing Sheets

MEMORY AND OPERATION METHOD THEREOF, AND MEMORY SYSTEM

CROSS-REFERENCE TO RELATED APPLICATIONS

This application claims priority to Chinese Patent Application No. 202410551178.9, filed on Apr. 30, 2024, which is hereby incorporated by reference in its entirety.

TECHNICAL FIELD

Examples of the present disclosure relate to the technical field of semiconductors, and particularly to a memory and an operation method thereof, and a memory system.

BACKGROUND

A memory is a storage apparatus for storing information in modern information technologies. However, as requirements of people for the storage apparatus become increasingly high, there is still much room for improvements to the memory.

SUMMARY

In view of this, examples of the present disclosure provide a memory and an operation method thereof, and a memory system.

In a first aspect, examples of the present disclosure provide a memory, comprising: a plurality of word lines; a plurality of memory cells coupled with each word line; and a peripheral circuit coupled to the plurality of word lines and configured to: during a refresh operation on a memory cell coupled with at least one selected word line in the plurality of word lines, apply a first voltage to an unselected word line adjacent to the selected word line by turning on a first voltage transmission circuit and at least partially turning off a second voltage transmission circuit.

In some examples, the peripheral circuit is further configured to: during a read or write operation on a memory cell coupled with one selected word line in the plurality of word lines, apply the first voltage to an unselected word line adjacent to the selected word line by turning on the first voltage transmission circuit and turning on the second voltage transmission circuit.

In some examples, the peripheral circuit is further configured to: start to apply a precharge voltage to the selected word line at a first timing; start to float the selected word line at a third timing after the first timing; apply the first voltage to the unselected word line adjacent to the selected word line in a first period before the first timing, and apply a second voltage to the unselected word line adjacent to the selected word line in a second period after the first timing and before the third timing, wherein the first voltage and the second voltage are both negative voltages, and the first voltage is less than the second voltage.

In some examples, the peripheral circuit comprises: the first voltage transmission circuit coupled with a word-line driver circuit and configured to: apply the first voltage to the word-line driver circuit in the first period during read, write, and refresh operations; the second voltage transmission circuit coupled with the word-line driver circuit and configured to: apply the first voltage to the word-line driver circuit in the first period during read and write operations; and disconnect the application of the first voltage to the word-line driver circuit in the first period during the refresh operation; a third voltage transmission circuit coupled with the word-line driver circuit and configured to: apply the second voltage to the word-line driver circuit in the second period during the read, write, and refresh operations; and the word-line driver circuit configured to: during the read, write, and refresh operations, apply the received precharge voltage to the selected word line, and apply a voltage received from the first voltage transmission circuit, the second voltage transmission circuit, or the third voltage transmission circuit to the unselected word line adjacent to the selected word line.

In some examples, the word-line driver circuit is configured to: at a second timing before the first timing, change the voltage applied to the unselected word line adjacent to the selected word line from the second voltage to the first voltage; and at a fourth timing before the third timing and after the first timing, change the voltage applied to the unselected word line adjacent to the selected word line from the first voltage to the second voltage.

In some examples, the first voltage transmission circuit is configured to apply the first voltage to the word-line driver circuit at the second timing in response to a second control signal being in a valid state; the second voltage transmission circuit is configured to apply the first voltage to the word-line driver circuit at the second timing in response to a refresh control signal being in an invalid state; and disconnect the application of the first voltage to the word-line driver circuit at the second timing in response to the refresh control signal being in a valid state; and the third voltage transmission circuit is configured to apply the second voltage to the word-line driver circuit at the fourth timing in response to a first control signal being in a valid state.

In some examples, the first voltage transmission circuit is configured to apply the first voltage to the word-line driver circuit at the second timing in response to the second control signal being in the valid state and a word line select signal being in a valid state; the second voltage transmission circuit is configured to apply the first voltage to the word-line driver circuit at the second timing in response to the refresh control signal being in the invalid state, the second control signal being in the valid state, and the word line select signal being in the valid state.

In some examples, the third voltage transmission circuit comprises a first transistor group, and the first transistor group comprises a plurality of first transistors, each first transistor having a first end receiving the first control signal, a second end receiving the second voltage, and a third end connected with the word-line driver circuit.

In some examples, the first voltage transmission circuit comprises a second transistor group and a third transistor group; the second transistor group comprises a plurality of second transistors, each second transistor having a first end receiving the second control signal, a second end connected with a third transistor, and a third end connected with the word-line driver circuit; the third transistor group comprises a plurality of third transistors, each third transistor having a first end receiving the word line select signal, a second end receiving the first voltage, and a third end connected with the second transistor; the second voltage transmission circuit comprises a fourth transistor group, a fifth transistor group, and a sixth transistor group; the fourth transistor group comprises a plurality of fourth transistors, each fourth transistor having a first end receiving a refresh activation signal, a second end connected with a fifth transistor, and a third end connected with the word-line driver circuit; the fifth transistor group comprises a plurality of fifth transistors, each fifth transistor having a first end receiving the second control signal, a second end connected with a sixth transistor, and a third end connected with the fourth transistor; and the sixth transistor group comprises a plurality of sixth transistors, each sixth transistor having a first end receiving the word line select signal, a second end receiving the first voltage, and a third end connected with the fifth transistor.

In some examples, the second transistor group and the third transistor group each comprise a first number of transistors, and the fourth transistor group, the fifth transistor group, and the sixth transistor group each comprise a second number of transistors; the first number of second transistors, the first number of third transistors, the second number of fourth transistors, the second number of fifth transistors, and the second number of sixth transistors are each in a parallel cascade relationship; and the first number is greater than or equal to the second number.

In some examples, a ratio of the first number to the second number ranges from 9:3 to 1:1.

In some examples, the peripheral circuit further comprises: a refresh control signal generation circuit coupled with the second voltage transmission circuit and configured to: receive the precharge voltage, a ground voltage, and the refresh activation signal, and generate the refresh control signal according to the refresh activation signal, wherein the refresh activation signal being in a valid state indicates performing the refresh operation on the selected word line; a first control signal generation circuit coupled with the third voltage transmission circuit and configured to: receive the precharge voltage, the second voltage, and an enable control signal, and generate the first control signal according to the enable control signal, wherein the enable control signal being in a valid state indicates switching the word line select signal to the valid state; and a second control signal generation circuit coupled with both the first voltage transmission circuit and the second voltage transmission circuit and configured to: receive the precharge voltage, the first voltage, and the first control signal, and generate the second control signal according to the first control signal.

In some examples, there are a plurality of word-line driver circuits; the plurality of word-line driver circuits are disposed in one-to-one correspondence with the plurality of word lines; the word-line driver circuit is configured to: receive a main word line select signal, the word line select signal, and a precharge control signal, apply the received precharge voltage to the selected word line between the first timing and the third timing, apply the first voltage to the unselected word line adjacent to the selected word line between the second timing and the fourth timing, and apply the second voltage to the unselected word line adjacent to the selected word line before the second timing and after the fourth timing, wherein the main word line select signal being in a valid state indicates selecting one of a plurality of main word lines of the peripheral circuit, each main word line corresponding to a plurality of word lines; the word line select signal being in a valid state indicates selecting one of the plurality of word lines corresponding to the main word line; and the precharge control signal being in a valid state indicates applying the precharge voltage to the selected word line.

In some examples, the peripheral circuit further comprises: a first voltage generator coupled with the first voltage transmission circuit and the second voltage transmission circuit and configured to generate the first voltage; and a second voltage generator coupled with the third voltage transmission circuit and configured to generate the second voltage.

In some examples, the plurality of word-line driver circuits are divided into a plurality of groups, each group of word-line driver circuits corresponding to one first voltage generator, one second voltage generator, one first voltage transmission circuit, one second voltage transmission circuit, and one third voltage transmission circuit.

In a second aspect, examples of the present disclosure further provide a memory, comprising: a plurality of word lines; a plurality of memory cells coupled with each word line; and a peripheral circuit coupled to the plurality of word lines, the peripheral circuit comprising a first voltage generator, a second voltage generator, a first voltage transmission circuit, a second voltage transmission circuit, a third voltage transmission circuit, and a plurality of word-line driver circuits, wherein the first voltage transmission circuit and the second voltage transmission circuit are connected in parallel between the first voltage generator and the plurality of word-line driver circuits, the third voltage transmission circuit is connected between the second voltage generator and the plurality of word-line driver circuits, and the plurality of word-line driver circuits are coupled with the plurality of word lines.

In some examples, the peripheral circuit further comprises a refresh control signal generation circuit, a first control signal generation circuit, and a second control signal generation circuit, wherein the refresh control signal generation circuit is connected with the second voltage transmission circuit; the first control signal generation circuit is connected with the third voltage transmission circuit; and the second control signal generation circuit is connected with both the first voltage transmission circuit and the second voltage transmission circuit.

In some examples, the third voltage transmission circuit comprises a first transistor group, and the first transistor group comprises a plurality of first transistors, each first transistor having a first end connected with the first control signal generation circuit, a second end connected with the second voltage generator, and a third end connected with the word-line driver circuit.

In some examples, the first voltage transmission circuit comprises a second transistor group and a third transistor group; the second transistor group comprises a plurality of second transistors, each second transistor having a first end connected with the second control signal generation circuit, a second end connected with a third transistor, and a third end connected with the word-line driver circuit; the third transistor group comprises a plurality of third transistors, each third transistor having a first end receiving a word line select signal, a second end connected with the second voltage generator, and a third end connected with the second transistor; the second voltage transmission circuit comprises a fourth transistor group, a fifth transistor group, and a sixth transistor group; the fourth transistor group comprises a plurality of fourth transistors, each fourth transistor having a first end connected with the refresh control signal generation circuit, a second end connected with a fifth transistor, and a third end connected with the word-line driver circuit; the fifth transistor group comprises a plurality of fifth transistors, each fifth transistor having a first end connected with the second voltage generator, a second end connected with a sixth transistor, and a third end connected with the fourth transistor; and the sixth transistor group comprises a plurality of sixth transistors, each sixth transistor having a first end receiving the word line select signal, a second end receiving a first voltage, and a third end connected with the fifth transistor.

In some examples, the second transistor group and the third transistor group each comprise a first number of transistors, and the fourth transistor group, the fifth transistor group, and the sixth transistor group each comprise a second number of transistors; the first number of second transistors, the first number of third transistors, the second number of fourth transistors, the second number of fifth transistors, and the second number of sixth transistors are each in a parallel cascade relationship; and the first number is greater than or equal to the second number.

In some examples, a ratio of the first number to the second number ranges from 9:3 to 1:1.

In a third aspect, examples of the present disclosure further provide a memory system, comprising: at least one memory as described in the examples of the present disclosure; and a controller coupled to the memory and configured to control the memory.

In a fourth aspect, examples of the present disclosure further provide an operation method of a memory, comprising: during a refresh operation on a memory cell coupled with at least one selected word line in a plurality of word lines, applying a first voltage to an unselected word line adjacent to the selected word line by turning on a first voltage transmission circuit and at least partially turning off a second voltage transmission circuit.

In some examples, the method further comprises: during a read or write operation on a memory cell coupled with one selected word line in the plurality of word lines, applying the first voltage to an unselected word line adjacent to the selected word line by turning on the first voltage transmission circuit and turning on the second voltage transmission circuit.

In some examples, the method further comprises: starting to apply a precharge voltage to the selected word line at a first timing; starting to float the selected word line at a third timing after the first timing; and applying the first voltage to the unselected word line adjacent to the selected word line in a first period before the first timing, and applying a second voltage to the unselected word line adjacent to the selected word line in a second period after the first timing and before the third timing, wherein the first voltage and the second voltage are both negative voltages, and the first voltage is less than the second voltage.

In some examples, the method further comprises: starting to apply the precharge voltage to the selected word line at the first timing, and at a second timing before the first timing, changing the voltage applied to the unselected word line adjacent to the selected word line from the second voltage to the first voltage; and starting to float the selected word line at the third timing after the first timing, and at a fourth timing before the third timing and after the first timing, changing the voltage applied to the unselected word line adjacent to the selected word line from the first voltage to the second voltage.

Examples of the present disclosure provide the memory and the operation method thereof, and the memory system. The memory may apply the first voltage to the unselected word line adjacent to the selected word line by turning on the first voltage transmission circuit and at least partially turning off the second voltage transmission circuit. Since the first voltage transmission circuit and the second voltage transmission circuit are both connected between the first voltage and the unselected word line, at least partially turning off the second voltage transmission circuit may reduce an effective path between the first voltage and the unselected word line, reducing current consumption at the first voltage without changing a supply source of the first voltage, and thereby reducing a refresh current during a refresh.

BRIEF DESCRIPTION OF THE DRAWINGS

In the accompanying drawings, unless otherwise specified, identical or similar components or elements are represented by a like numeral throughout several drawings. These drawings are not necessarily drawn to scale. It is to be understood that, these drawings merely describe some implementations according to the present disclosure, and should not be considered as limiting the scope of the present disclosure.

DETAILED DESCRIPTION

Figure 1:
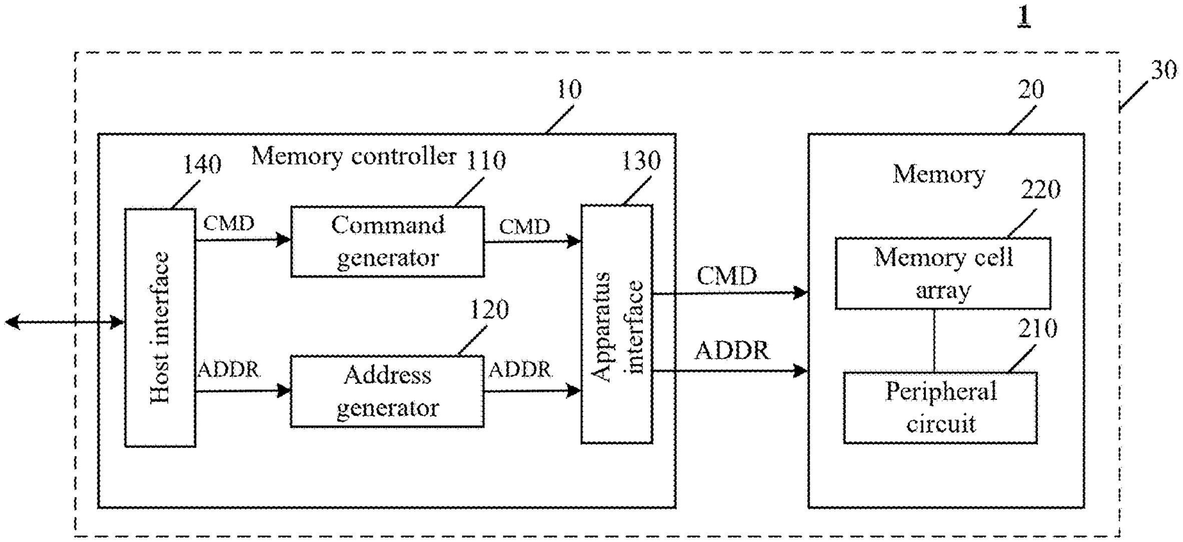
FIG. 1 illustrates a schematic diagram of an example structure of an example electronic apparatus having a memory according to an example of the present disclosure.

Example implementations disclosed by the present disclosure will be described below in more details with reference to the drawings. Although the example implementations of the present disclosure are shown in the drawings, it is to be understood that the present disclosure may be implemented in any form without being limited by the particular implementations as set forth herein. Rather, these implementations are provided to understand the present disclosure more thoroughly, and can fully convey the scope disclosed by the present disclosure to those skilled in the art.

In the descriptions below, many particular details are presented to provide a more thorough understanding of the present disclosure. However, it is apparent to those skilled in the art that the present disclosure may be implemented without one or more of these details. In other examples, in order to avoid confusion with the present disclosure, some technical features well-known in the art are not described. Namely, not every feature of the actual examples is described here, and well-known functions and structures are not described in detail.

Furthermore, the drawings are merely schematic illustrations of the present disclosure and are not necessarily drawn to scale. Same reference numerals denote same or like parts, and thus repeated descriptions thereof are omitted. Some block diagrams shown in the drawings are functional entities and do not necessarily correspond to physically or logically separate entities. These functional entities may be implemented in a software form, or implemented in one or more hardware modules or integrated circuits, or implemented in different networks and/or processor devices and/or microcontroller devices.

The flow diagram shown in the drawings is merely an example illustration and does not necessarily comprise all the operations. For example, some operations may be divided, and some operations may be combined or partially combined, so that an actual order of execution may change depending on actual situations.

The terms used herein are only intended to describe the examples, and are not used as limitations to the present disclosure. As used herein, unless otherwise indicated expressly in the context, “a”, “one” and “the” in a singular form also includes a plural form. It is also to be understood that terms “comprising” and/or “including”, when used in the present disclosure, determine the presence of described features, integers, steps, operations, elements and/or components, but do not preclude the presence or addition of one or more of other features, integers, steps, operations, elements, components, and/or groups. As used herein, the term “and/or” comprises any and all combinations of relevant items listed.

FIG. 1 illustrates a schematic diagram of an example structure of an example electronic apparatus 1 having a memory according to an example of the present disclosure. The electronic apparatus 1 may comprise a mobile phone, a desktop computer, a laptop computer, a tablet, a vehicle computer, a gaming console, a printer, a positioning apparatus, a wearable electronic apparatus, a smart sensor, a virtual reality (VR) apparatus, an augmented reality (AR) apparatus, or any other suitable electronic apparatuses having a storage therein. As shown in FIG. 1, the electronic apparatus 1 may comprise a host HOST and a memory system 30, and the memory system 30 comprises a memory controller 10 and one or more memories 20. The host HOST may be a processor (such as a Central Processing Unit (CPU), or a Graphic Processing Unit (GPU)) of the electronic apparatus. The host HOST may be configured to send or receive data to or from the memory 20. The memory controller 10 is coupled to the memory 20 and the host HOST, and configured to control the memory 20. The memory controller 10 can manage data stored in the memory 20 and communicate with the host HOST.

The memory controller 10 may be configured to control operations of the memory 20, such as read, erase, write and refresh operations. In some implementations, the memory controller 10 is further configured to process an Error Correction Code (ECC) with respect to data read from or written to the memory 20. The memory controller 10 may further execute any other suitable functions, e.g., formatting the memory 20.

In some examples, the memory controller 10 and one or more memories 20 may be integrated into various types of electronic apparatuses. For example, the memory controller 10 may be integrated into a north bridge of a computer mainboard or directly integrated inside a CPU of a computer, and the plurality of memories 20 may be integrated into a memory module. That is, the memory system 30 may be implemented and packaged into different types of end electronic products.

The memory controller 10 may send/receive data to/from the host HOST, and may send a command CMD and an address ADDR to the memory 20. The memory controller 10 may comprise a command generator 110, an address generator 120, an apparatus interface 130 and a host interface 140. The host interface 140 may receive a command CMD and an address ADDR from the host HOST. The command generator 110 may generate an access command, and a row hammer refresh command etc. by decoding the command CMD received from the host HOST, and may provide the access command and the row hammer refresh command to the memory 20 through the apparatus interface 130. The access command may be a signal that instructs the memory 20 to write or read data by accessing a row of a memory cell array 220 corresponding to the address ADDR. The row hammer refresh command may be a signal for instructing the memory 20 to perform an additional refresh operation on a word line adjacent to a word line intensively accessed in a short period of time. In other words, the additional refresh operation may be performed on the word line adjacent to the word line accessed many times in a short period of time. A massive access may be a result of repeated requests to access the same word line.

The address generator 120 in the memory controller 10 may generate a row address and a column address to be accessed in the memory cell array 220 by decoding the address ADDR received from the host interface 140. Furthermore, the memory 20 may generate an address of a memory bank to be accessed when the memory cell array 220 comprises a plurality of memory banks.

Moreover, the memory controller 10 may control memory operations such as write and read, by providing various signals to the memory 20 via the apparatus interface 130.

For example, the memory controller 10 may provide a write command to the memory 20. The write command is to instruct the memory 20 to perform the write operation to store data into the memory 20. In some examples, the memory 20 comprises the memory cell array 220 and a peripheral circuit 210. The memory cell array 220 comprises a plurality of memory banks, each memory bank comprises a plurality of memory blocks, each memory block comprises a plurality of memory cell rows and a plurality of memory cell columns, each memory cell row is coupled with one corresponding word line, and each memory cell column is coupled with one corresponding bit line. The peripheral circuit 210 may write or read data to or from the memory cell array 220 based on the command CMD and the address ADDR received from the memory controller 10, or may provide a control signal CTRL for refreshing a memory cell included in the memory cell array 220 to a row decoder and a column decoder. In other words, the peripheral circuit 210 may perform all operations to process the data stored in the memory cell array 220. The peripheral circuit 210 may comprise: a control circuit corresponding to each memory block, such as a sensing amplifier (SA) circuit, a word-line driver (WLD) circuit, etc.; a control circuit corresponding to each memory bank, such as a row decoder, a column decoder, etc.; and a control circuit corresponding to all the memory banks, such as a command buffer, a command decoder, an address buffer, a data input/output buffer, a mode register, etc.

The memory 20 may comprise a Random Access Memory (RAM), such as a Dynamic Random Access Memory (DRAM), a synchronous DRAM (SDRAM), a static RAM (SRAM), a double data rate SDRAM (DDR SDRAM), a DDR2 SDRAM, a DDR3 SDRAM, a low power double data rate SDRAM (Low Power DDR SDRAM), an LPDDR2, an LPDDR3, an LPDDR4, an LPDDR5, a phase change RAM (PRAM), a magnetic RAM (MRAM), a resistive RAM (RRAM), or the like. The following illustration is performed only using the DRAM as an example.

Figure 2:
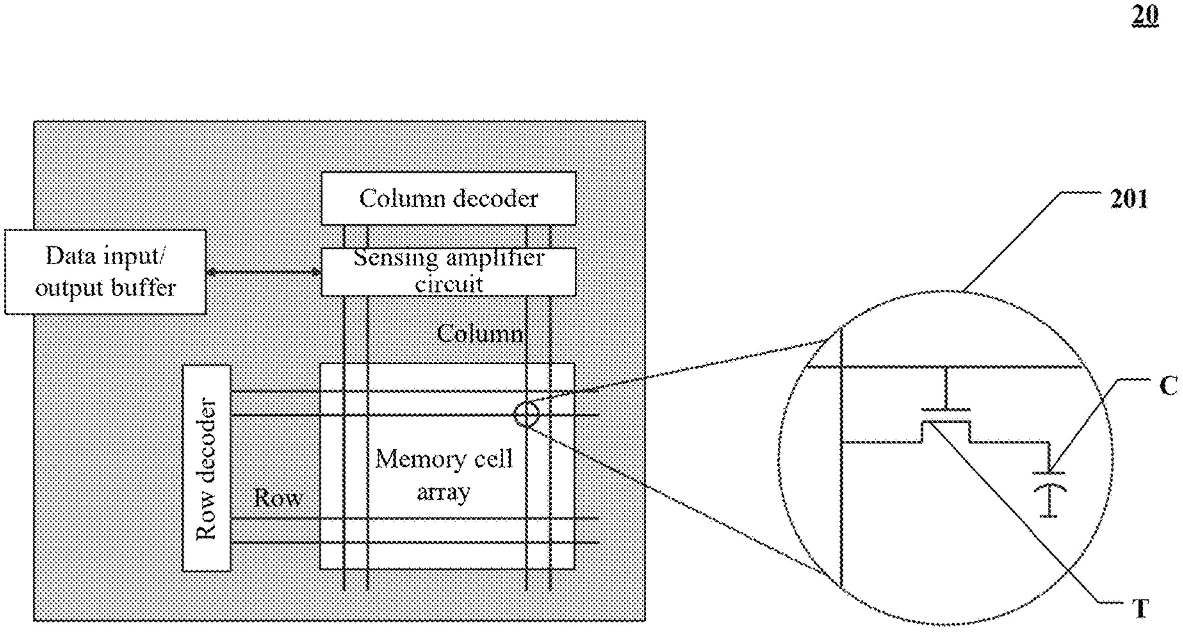
FIG. 2 is a schematic diagram of an example dynamic random access memory according to an example of the present disclosure.
Figure 3:
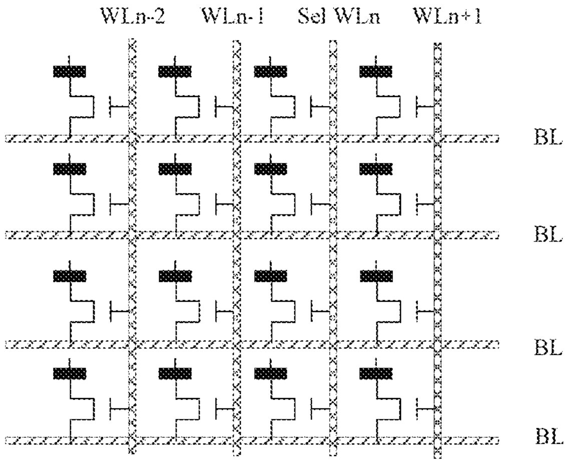
FIG. 3 is a schematic connection diagram of a word line, a bit line, and a memory cell of the example dynamic random access memory according to an example of the present disclosure.

FIG. 2 is a schematic diagram of an example dynamic random access memory according to an example of the present disclosure. FIG. 3 is a schematic connection diagram of a word line, a bit line, and a memory cell of the example dynamic random access memory according to an example of the present disclosure.

On the right side of FIG. 2, a circuit of the memory cell in the DRAM is shown. The DRAM comprises at least one DRAM die, and each DRAM die comprises a memory cell array. The memory cell array comprises a plurality of memory cells 201 arranged in an array, and each memory cell 201 comprises one Transistor (T) and one Capacitor (C). A main action principle of the memory cell is to use an amount of charge stored in the capacitor to represent whether a binary bit is 1 or 0. The memory cells are arranged in an array, which may be considered as a typical mesh structure. The mesh structure may be referred to e.g., FIG. 3. The memory cell array designates an address using a row and a column. By designating an intersection of the row and the column (by designating a row address and a column address of the DRAM), a memory controller may access each memory cell in the DRAM die independently, and perform a read, write, or refresh operation on data stored in the memory cell.

The memory cell of the DRAM essentially is a capacitor that stores charge. There may be a leakage in the capacitor during read, write, and refresh, and the read itself may result in a damage. On that basis, it is required to perform a refresh operation after a read operation or when the memory cell is not accessed for a longer time.

The data stored in the memory cell depends on the charge in the capacitor, and the charge is susceptible between refresh cycles. Drifting electrons may migrate into or out of the memory cell, thereby changing the charge in the memory cell. If a plurality of accesses to a row address are made in a shorter period of time, an accumulated change in a charge in a memory cell of a row adjacent to the address may be sufficient to vary a perceived state of a memory value, which is a row hammer phenomenon. As the size decreases, the row where the perceived state of the memory value varies may not just the adjacent row, but even a nearby row (two or more rows apart) may be affected.

Figure 4:
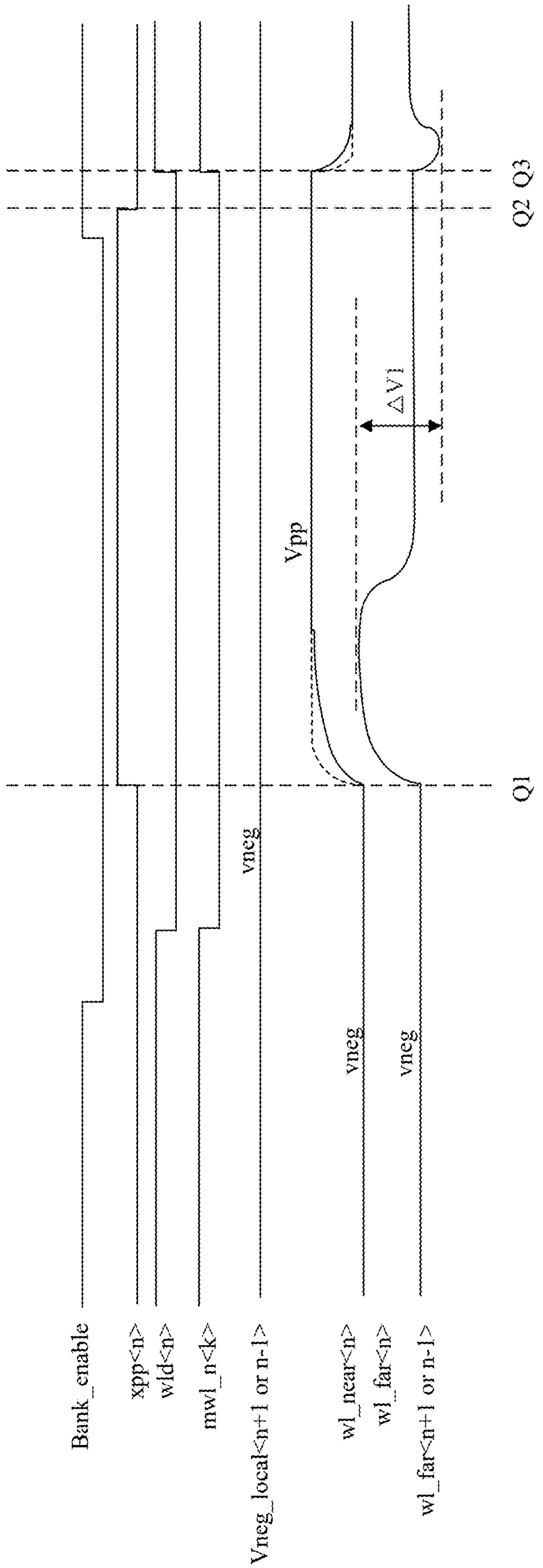
FIG. 4 is a schematic diagram I of voltage timings of related signal, word line, and voltage transfer line during an example access to a select word line according to an example of the present disclosure.

FIG. 4 is a schematic diagram of voltage timings of related signal, word line, and voltage transfer line during an example access to a select word line according to an example of the present disclosure. It is to be noted that the select word line wl<n> involved below may be interpreted as a word line connected with a memory cell to be accessed. The select word line is similar to a selected word line, both being used to determine a target memory cell to be subjected to a read, write, or other operations, and thus these two terms may be used interchangeably to express similar meanings. An adjacent non-select word line wl<n+1 or n−1> (which may be used interchangeably with an adjacent unselected word line) may be interpreted as a word line adjacent to a physical address of the select word line. Vneg_local<n> (not shown in FIG. 4) may be interpreted as a voltage transfer line coupled with the select word line at one end and supplying a voltage to the select word line, and the other end of Vneg_local<n> is coupled with a power supply end. Vneg_local<n+1 or n−1> may be interpreted as a voltage transfer line coupled with an adjacent non-select word line wl<n+1 or n−1> at one end and supplying a voltage to the adjacent non-select word line, and the other end of Vneg_local<n+1 or n−1> is likewise coupled with the power supply end. Furthermore, due to a longer length of the select word line wl<n>, which results in a non-negligible resistance, when the select word line is coupled with Vneg_local<n>, an end of the select word line near Vneg_local<n> is referred to as a near end wl_near<n> of the select word line, and an end of the select word line far away from Vneg_local<n> is referred to as a far end wl_far<n> of the select word line. Similarly, an end of the adjacent non-select word line near Vneg_local<n+1 or n−1> is referred to as a near end wl_near<n+1 or n−1> of the adjacent non-select word line, and an end of the adjacent non-select word line far away from Vneg_local<n+1 or n−1> is referred to as a far end wl_far<n+1 or n−1> of the adjacent non-select word line.

For ease of understanding, the present disclosure is illustrated using the far end wl_far<n+1 or n−1> of the adjacent non-select word line as an example, which, however, is not intended to limit the protection scope of the present disclosure. The explanatory illustrations in the examples of the present disclosure are also applicable to the near end wl_near<n+1 or n−1> of the adjacent non-select word line.

As shown in FIG. 4, under a condition of an enabled state (e.g., a low-level voltage) of a memory bank select signal Bank_enable, a main word line select signal mwl_n<k>, and a word line select signal wld<n>, when a precharge control signal xpp<n> is switched from a disabled state (e.g., a low-level voltage) to an enabled state (e.g., a high-level voltage), the memory starts a precharge operation on the select word line at a first time node Q1. Durations starting from the first time node Q1 required to charge the near end wl_near<n> of the select word line (a portion illustrated by a dashed line parabola after Q1 in FIG. 4) and the far end wl_far<n> of the select word line (a portion illustrated by a solid line below the dashed line after Q1 in FIG. 4) from an initial voltage vneg to a voltage Vpp are different. It may be understood that the near end wl_near<n> of the select word line may be charged to the voltage Vpp faster, because it is closer to Vneg_local<n>, i.e., closer to the power supply end. The far end wl_far<n> of the select word line is farther away from Vneg_local<n>, and thus is charged to the voltage Vpp with a longer duration. As presented in FIG. 4, a slope of a dashed line parabola portion is greater than a slope of a solid line parabola portion. For the adjacent non-select word line wl<n+1 or n−1>, an illustration is made using the far end wl_far<n+1 or n−1> of the adjacent non-select word line as an example. Starting from the first time node Q1, a voltage on the far end wl_far<n> of the select word line is charged from the initial voltage vneg to the voltage Vpp, and during a voltage increase of the far end wl_far<n> of the select word line, a voltage on the far end wl_far<n+1 or n−1> of the adjacent non-select word line increases gradually due a coupling effect between word lines. After the far end wl_far<n> of the select word line stabilizes at the voltage Vpp, the voltage on the far end wl_far<n+1 or n−1> of the adjacent non-select word line gradually decreases to be equal to or slightly greater than the initial voltage vneg.

At a second time node Q2 after the far end wl_far<n> of the select word line is stabilized at the voltage Vpp and the precharge control signal xpp<n> is switched from the enabled state (e.g., the high-level voltage) to the disabled state (e.g., the low-level voltage), the memory begins to float the select word line.

Next, the select word line starts to discharge at a third time node Q3 after a certain buffer time following the second time node Q2. Here, such buffer discharge may be realized by a falling edge delay circuit. The near end wl_near<n> of the select word line (a portion illustrated by a dashed line parabola after Q3 in FIG. 4) starts from the third time node Q3 to discharge from the voltage Vpp to the initial voltage vneg for a shorter duration than the far end wl_far<n> of the select word line (a portion illustrated by a solid line parabola above the dashed line parabola after Q3 in FIG. 4). At this time, during a voltage increase of the far end wl_far<n> of the select word line, the voltage on the far end wl_far<n+1 or n−1> of the adjacent non-select word line gradually decreases to be less than the initial voltage vneg due to the coupling effect between the word lines. After the voltage on the far end wl_far<n> of the select word line stabilizes at the initial voltage vneg, the voltage on the far end wl_far<n+1 or n−1> of the adjacent non-select word line gradually increases to the vicinity of the initial voltage vneg. As such, during the precharge operation and subsequent discharge of the select word line, as the voltage on the select word line increases or decreases, there is a larger voltage difference in the adjacent non-select word line due to the coupling effect. The voltage difference ΔV1 is as shown in FIG. 4. On the one hand, the voltage change ΔV1 may cause a change in a perceived state of a memory value of a memory cell coupled with the adjacent non-select word line, thereby threatening data security and aggravating the row hammer problem; on the other hand, it may lead to a risk of Gate-Induced Drain Leakage (GIDL), causing a hole accumulation and increasing floating body potential, wherein a higher floating body potential may turn on a parasitic transistor between a floating body and a drain junction, resulting in a series of problems.

A harm caused by the row hammer may be relieved to some extent by increasing a periodic refresh frequency, which may ensure that each row is refreshed before the row hammer causes damage to the cell charge that is sufficient to result in an error. However, the above method consumes additional time or power, thus increasing system power consumption and degrading system performance. Moreover, the GIDL leakage is an unresolved hazard.

Figure 5:
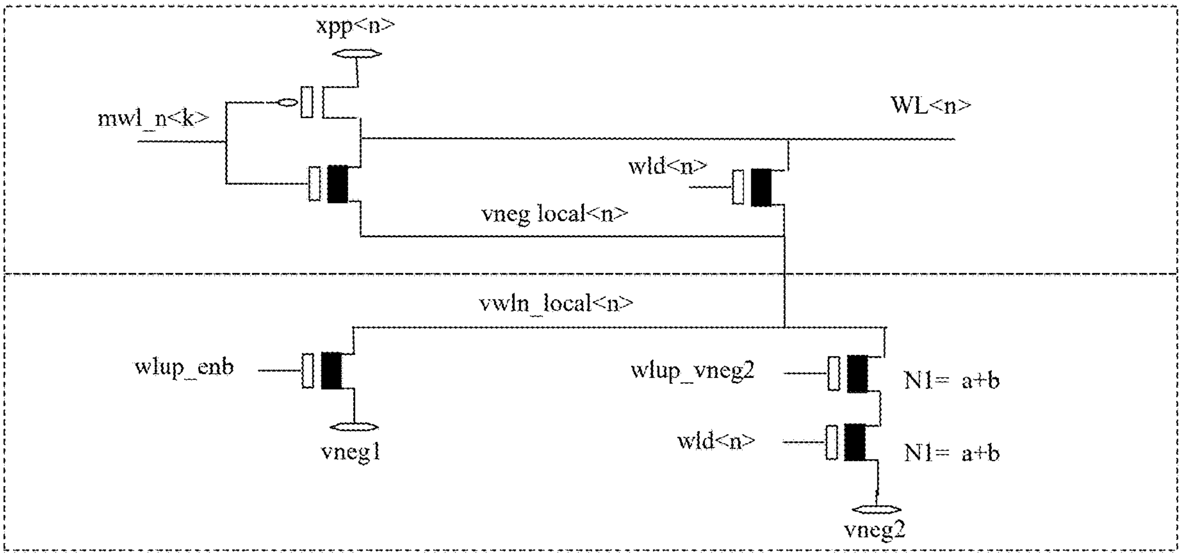
FIG. 5 is a schematic diagram I of a voltage transmission circuit and a word-line driver circuit of an example memory according to an example of the present disclosure.
Figure 6:
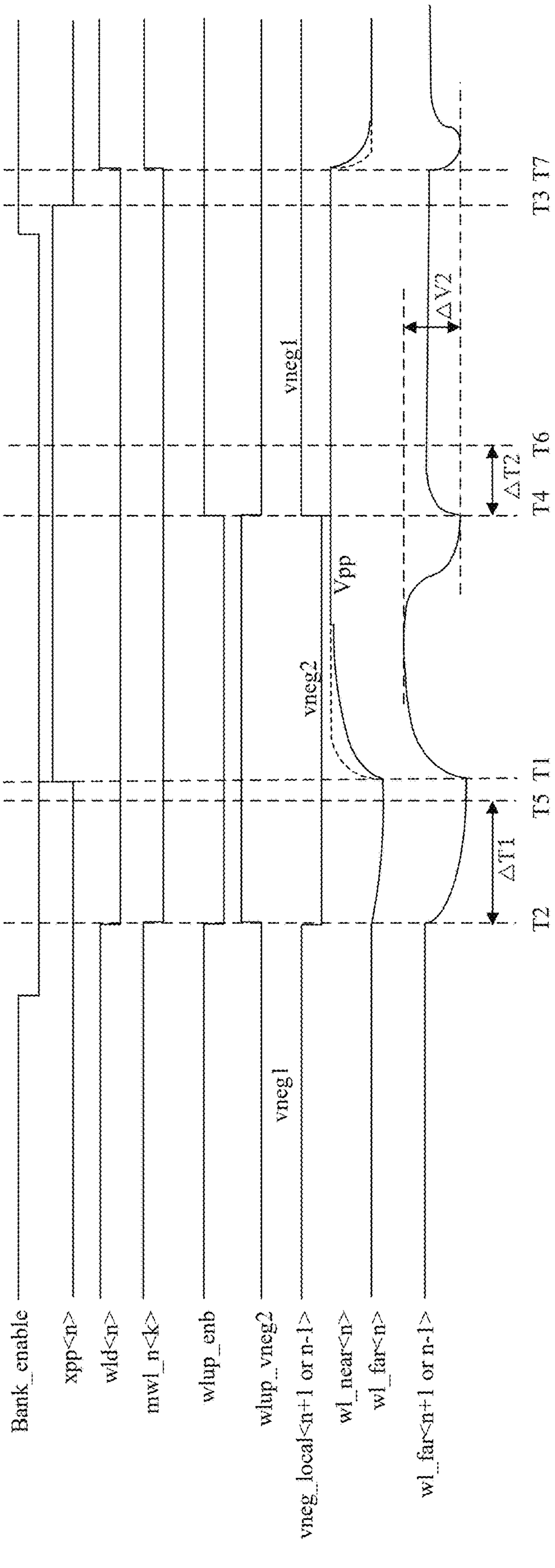
FIG. 6 is a schematic diagram II of the voltage timings of the related signal, word line, and voltage transfer line during the example access to the select word line according to an example of the present disclosure.

It is required to reduce the larger voltage difference on the adjacent non-select word line caused by the coupling effect, so as to alleviate the row hammer problem and the GIDL leakage problem. To this end, examples of the present disclosure provide a memory. FIG. 5 is a schematic diagram I of a voltage transmission circuit and a word-line driver circuit of an example memory according to an example of the present disclosure. FIG. 6 is a schematic diagram of voltage timings of related signal, word line, and voltage transfer line during an access to the select word line corresponding to the implementation in FIG. 5. It is to be noted that meanings of the relate signal, word line, and voltage transfer line shown in FIG. 6 may be understood with reference to those in FIG. 4. wlup_enb is a control signal for controlling whether to apply vneg1 to the adjacent non-select word line; and wlup_vneg2 is a control signal for controlling whether to apply vneg2 to the adjacent non-select word line. Here, vneg1 and vneg2 may both be negative voltages, vneg1 may be equal to vneg as described previously, and vneg2 may be less than vneg1.

As shown in FIG. 5, an upper dashed line box in FIG. 5 illustrates the word-line driver circuit, and a lower dashed line box in FIG. 5 illustrates the voltage transmission circuit, wherein the voltage transmission circuit between vneg1 and Vneg_local<n> controls the connectivity between vneg1 and the non-select word line adjacent to the select word line, and the voltage transmission circuit between vneg2 and Vneg_local<n> controls the connectivity between vneg2 and the non-select word line adjacent to the select word line. It is to be noted that in FIG. 5, the voltage transmission circuit between vneg2 and Vneg_local<n> may comprise a transistor group controlled by wld<n> and a transistor group controlled by wlup_vneg2, wherein each transistor group comprises a plurality (e.g., a+b) of transistors connected in parallel.

The effects achieved by the word-line driver circuit and the voltage transmission circuit shown in FIG. 5 are that: at a first timing T1, the precharge voltage Vpp starts to be supplied to the select word line in a plurality of word lines; at a second timing T2 before the first timing T1, the voltage supplied to the non-select word line adjacent to the select word line is changed from vneg1 to vneg2; at a third timing T3 after the first timing T1, the select word line starts to be floated; and at a fourth timing T4 before the third timing T3 and after the first timing T1, the voltage supplied to the adjacent non-select word line is changed from vneg2 to vneg1.

As shown in FIG. 6, under the condition of the enabled states of the memory bank select signal Bank_enable, the main word line select signal mwl_n<k>, and the word line select signal wld<n>, when the precharge control signal xpp<n> is switched from the disabled state to the enabled state, the precharge operation is performed on the select word line at the first timing T1. Durations starting from the first timing T1 required to charge the near end wl_near<n> of the select word line (a portion illustrated by a dashed line parabola after T1 in FIG. 6) and the far end wl_far<n> of the select word line (a portion illustrated by a solid line below the dashed line after T1 in FIG. 6) from vneg1 to the precharge voltage Vpp are different.

It is to be noted that the enabled states of the memory bank select signal Bank_enable, the main word line select signal mwl_n<k>, and the word line select signal wld<n> are all low-level voltages, such as Vss, and the disabled states are all high-level voltages, such as Vpp or Vdd. An enabled state of the precharge control signal xpp<n> is a high-level voltage, such as Vpp or Vdd, and a disabled state is a low-level voltage, such as Vss.

wld<n> shown in FIG. 6 represents a word line select signal of the select word line, and a word line select signal corresponding to the adjacent non-select word line is always in a disabled state, i.e., a high-level voltage, which is not shown in FIG. 6.

For the adjacent non-select word line wl<n+1 or n−1>, an illustration is made using the far end wl_far<n+1 or n−1> of the adjacent non-select word line as an example. At the second timing T2 before the first timing T1, the voltage on Vneg_local<n+1 or n−1> changes from vneg1 to vneg2. It may be understood that the voltage supplied by Vneg_local<n+1 or n−1> to the far end wl_far<n+1 or n−1> of the non-select word line adjacent to the select word line changes from vneg1 to vneg2, wherein vneg2 is less than vneg1. As such, before precharge of the select word line starting from the first timing T1, the voltage supplied to the adjacent non-select word line is reduced in advance to reduce a starting voltage from which the adjacent non-select word line is pulled up by the coupling. An absolute voltage of the adjacent non-select word line pulled up by the coupling is reduced effectively, with a voltage rise on the adjacent non-select word line caused by the coupling effect being substantially unchanged.

In the examples of the present disclosure, at the third timing T3, the precharge control signal xpp<n> is switched from the enabled state to the disabled state, the memory stops the precharge operation on the select word line, and the memory starts to float the select word line.

In some examples, as shown in FIG. 6, at the third timing T3, the memory starts to float the select word line. At a seventh timing T7 after a certain buffer time following the third timing T3, the select word line is connected with vneg1, and the select word line starts to discharge from Vpp to vneg1.

For the adjacent non-select word line wl<n+1 or n−1>, an illustration is made still using the far end wl_far<n+1 or n−1> of the adjacent non-select word line as an example. At the fourth timing T4 before the third timing T3 and after the first timing T1, the voltage on Vneg_local<n+1 or n−1> changes from vneg2 to vneg1. It may be understood that the voltage supplied by Vneg_local<n+1 or n−1> to the far end wl_far<n+1 or n−1> of the non-select word line adjacent to the select word line changes from vneg2 to vneg1, and vneg2 is less than vneg1.

As such, before the select word line starts to be floated, the voltage supplied to the adjacent non-select word line is increased in advance to increase a starting voltage from which the adjacent non-select word line is pulled up by the coupling. An absolute voltage of the adjacent non-select word line pulled down by the coupling is increased effectively, with a voltage drop on the adjacent non-select word line caused by the coupling effect being substantially unchanged.

As shown in FIG. 6, the voltage supplied to the adjacent non-select word line is reduced before precharging the select word line, so as to control a final voltage to which the voltage on the adjacent non-select word line is pulled up by the coupling, which is a highest voltage resulting in a voltage change subsequently. At the same time, the voltage supplied to the adjacent non-select word line is increased before discharging the select word line, so as to control a final voltage to which the voltage on the adjacent non-select word line is pulled down by the coupling, which is a lowest voltage resulting in the voltage change subsequently. Since the highest voltage resulting in the voltage change is reduced and the lowest voltage resulting in the voltage change is increased, the voltage change ΔV2 on the adjacent non-select word line may be reduced effectively during a charge-discharge process of the select word line, thereby alleviating the row hammer problem and the GIDL leakage problem.

In the examples of the present disclosure, as shown in FIG. 6, at the fifth timing T5, the voltage on the adjacent non-select word line reaches vneg2, and a duration between the second timing T2 and the fifth timing T5 is a first duration ΔT1. At the sixth timing T6, the voltage on the adjacent non-select word line reaches vneg1, and a duration between the fourth timing T4 and the sixth timing T6 is a second duration ΔT2. A time difference between the first timing T1 and the second timing T2 is greater than or equal to the first duration ΔT1; and a time difference between the third timing T3 and the fourth timing T4 is greater than or equal to the second duration ΔT2.

It may be understood that when a voltage is transferred through Vneg_local<n+1 or n−1> to the adjacent non-select word line wl_<n+1 or n−1>, the voltage on Vneg_local<n+1 or n−1> changes from vneg1 to vneg2 at the timing T2, and time required for the voltage on the adjacent non-select word line wl_<n+1 or n−1> to decrease from vneg1 and then stabilize at vneg2 is the first duration ΔT1. Accordingly, the time difference between the first timing T1 and the second timing T2 here is greater than or equal to the first duration ΔT1, which may be understood as starting the precharge operation on the select word line when or after the voltage on the adjacent non-select word line wl_<n+1 or n−1> decreases to vneg2. When the voltage on the adjacent non-select word line wl_<n+1 or n−1> has not decreased to vneg2 and is between vneg1 and vneg2, the starting voltage from which the adjacent non-select word line wl_<n+1 or n−1> is pulled up by the coupling is not minimized by controlling.

Similarly, the time difference between the third timing T3 and the fourth timing T4 here is greater than or equal to the second duration ΔT2, which may be understood as starting the discharge operation on the select word line when or after the voltage on the adjacent non-select word line wl_<n+1 or n−1> increases to vneg1. When the voltage on the adjacent non-select word line wl_<n+1 or n−1> has not increased to vneg1 and is between vneg2 and vneg1, the starting voltage from which the adjacent non-select word line wl_<n+1 or n−1> is pulled down by the coupling is not maximized by controlling. As such, by setting the first duration, it is ensured that the voltage on the adjacent non-select word line has reached vneg2 before precharging the select word line, and by setting the second duration, it is ensured that the voltage on the adjacent non-select word line has reached vneg1 before discharging the select word line, thereby further improving the effect of controlling a voltage change amplitude on the adjacent non-select word line during the charge-discharge process of the select word line.

In the examples illustrated in FIG. 5 and FIG. 6, compared with the example illustrated in FIG. 4, vneg2 is added to the non-select word line adjacent to the select word line at a proper time, so as to reduce the large voltage difference on the adjacent non-select word line caused by the coupling effect, thereby alleviating the row hammer problem and the GIDL leakage problem.

As mentioned above, the memory requires periodic refresh operations to retain its data. During a refresh operation, the memory may refresh a plurality of rows in one memory bank at the same time. For example, if the memory has m memory banks, m*n rows will be refreshed at the same time in the refresh operation. In this case, a current for activating the m*n rows in the operation is m*n times greater than a current for activating only one row in a normal read/write operation.

In the above examples illustrated in FIG. 5 and FIG. 6, a negative driving voltage of the word line will be switched from vneg1 (e.g., −0.5 V) to vneg2 (e.g., −0.8 V) during an access operation. A current at vneg2 is larger during the access operation and will be several times larger during a refresh activated mode. Among memories of a LPDDR series, for a memory (e.g., LPDDR5) focusing on low-power characteristics, in the case where a refresh current is several times a normal read/write current, there is an urgent need to optimize the refresh current.

Considering that the row hammer problem caused in the example illustrated in FIG. 4 is still under solution, it is required to retain the switch of the negative driving voltage of the word line from vneg1 (e.g., −0.5 V) to vneg2 (e.g., −0.8 V). In view of this, another driving path that is closed only during the refresh operation is added, while the voltage transmission circuit between vneg2 and Vneg_local<n> is retained. This does not affect the normal write/read operation and is helpful to reduce the refresh current.

Figure 7A:
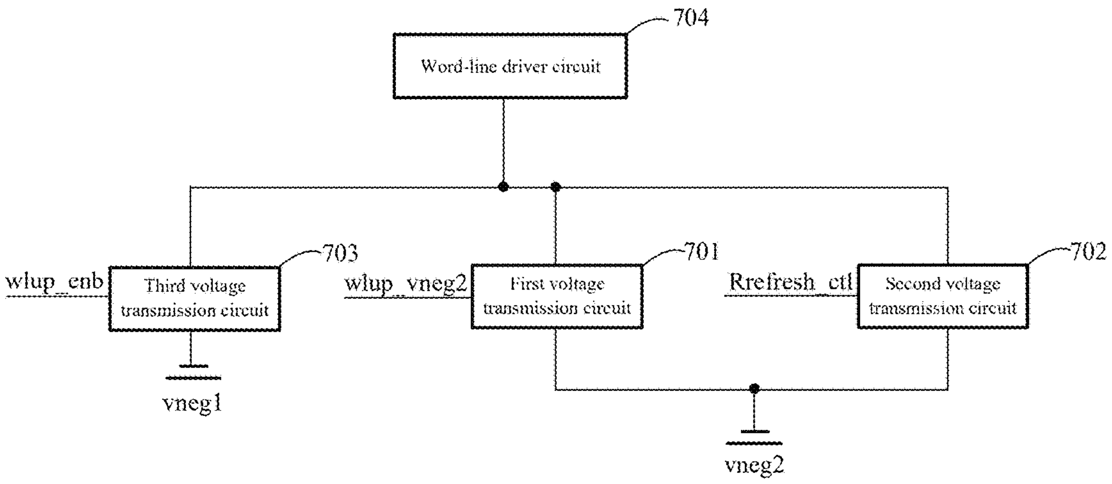
FIG. 7*a* is a schematic diagram II of the voltage transmission circuit and the word-line driver circuit of the example memory according to an example of the present disclosure.
Figure 7B:
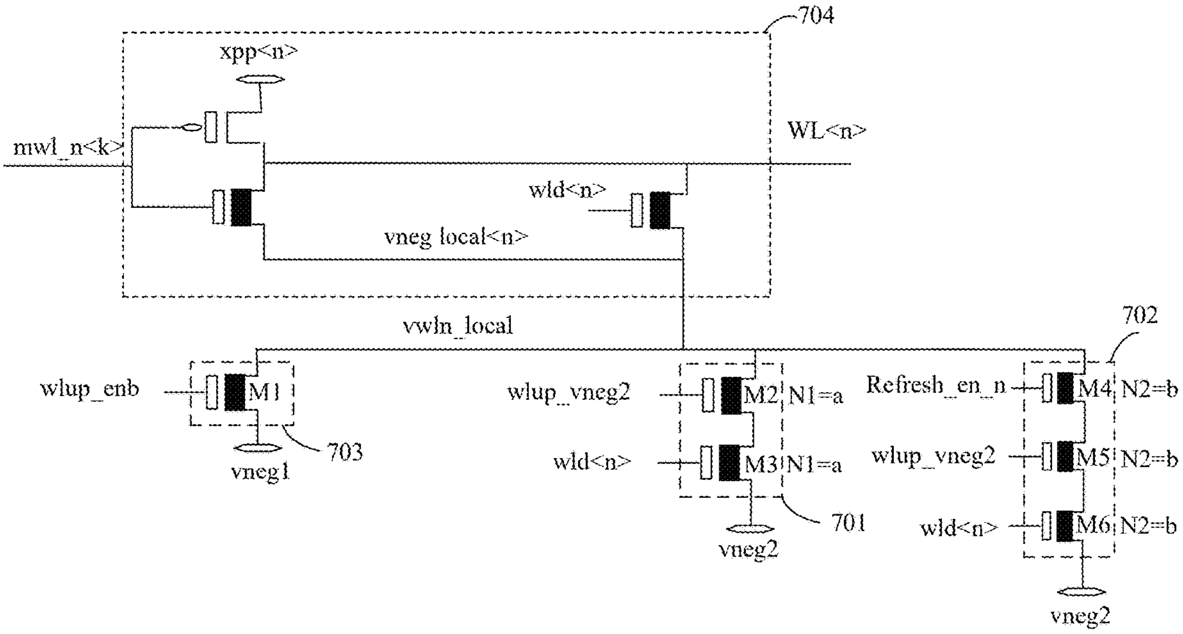
FIG. 7*b* is a schematic diagram III of the voltage transmission circuit and the word-line driver circuit of the example memory according to an example of the present disclosure.
Figure 8:
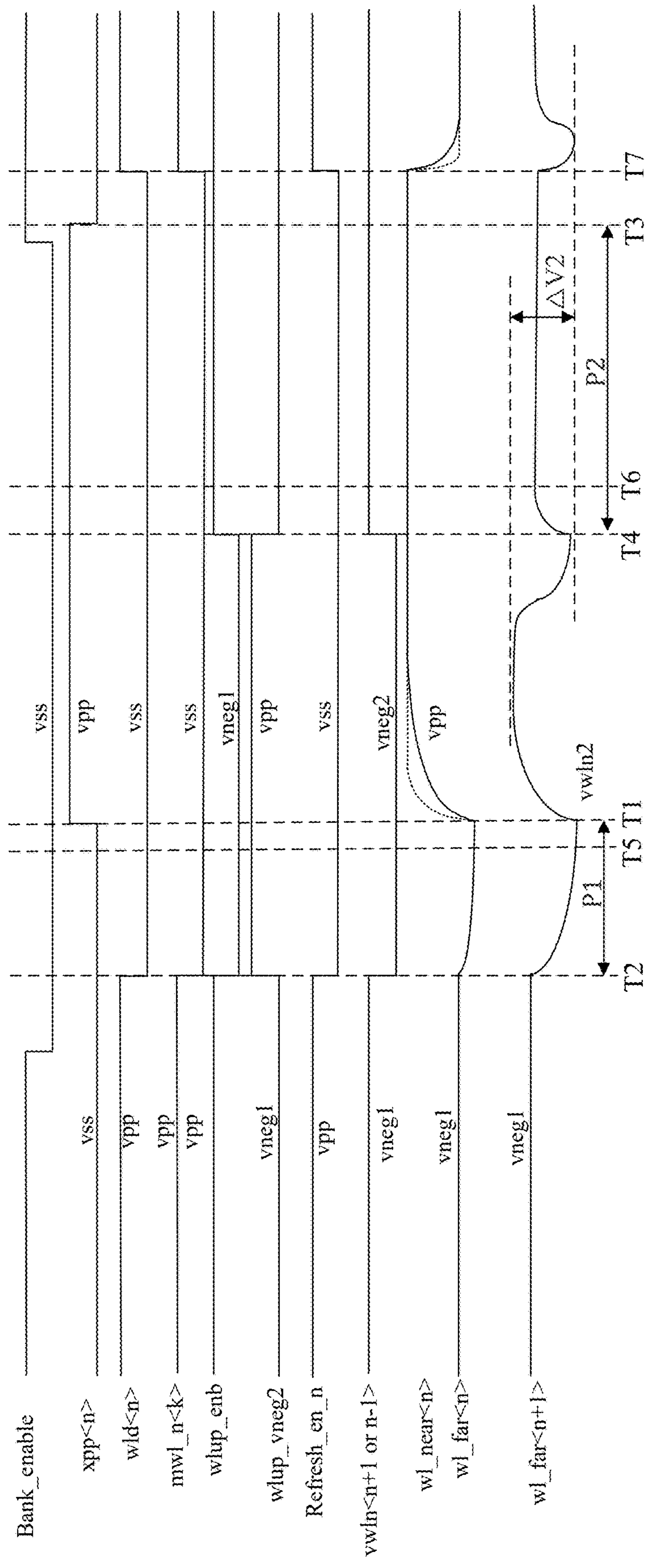
FIG. 8 is a schematic diagram III of the voltage timings of the related signal, word line, and voltage transfer line during the example access to the select word line according to an example of the present disclosure.

FIG. 7*a* is a schematic diagram I of the voltage transmission circuit and the word-line driver circuit of the example memory according to an example of the present disclosure. FIG. 7*b* is a schematic diagram II of the voltage transmission circuit and the word-line driver circuit of the example memory according to an example of the present disclosure. FIG. 8 is a schematic diagram of the voltage timings of the related signal, word line, and voltage transfer line during an access to the select word line corresponding to the implementation in FIG. 7*a* or 7*b*. It is to be noted that meanings of the relate signal, word line, and voltage transfer line shown in FIG. 8 may be understood with reference to those in FIG. 6. Refresh_en is a refresh activation signal for controlling whether the memory starts to perform the refresh operation; and Refresh_en_n is a refresh control signal for controlling the driving path that is closed only during the refresh operation. Change processes of the voltages on the selected word line and the unselected word line adjacent to the selected word line in each period in FIG. 8 may be understood with reference to change processes of the voltages on the selected word line and the unselected word line adjacent to the selected word line in each period in FIG. 6.

Examples of the present disclosure provide a memory, as shown in FIG. 7*a*, the memory comprising: a plurality of word lines; a plurality of memory cells coupled with each word line; and a peripheral circuit coupled to the plurality of word lines and configured to: during a refresh operation on a memory cell coupled with at least one selected word line in the plurality of word lines, apply a first voltage to an unselected word line adjacent to the selected word line by turning on a first voltage transmission circuit 701 and at least partially turning off a second voltage transmission circuit 702.

Here, the first voltage may be interpreted as vneg2 mentioned above, and the first voltage may be a negative voltage. A second voltage may be involved subsequently. The second voltage may be interpreted as vneg1 mentioned above, the second voltage may also be a negative voltage, and the first voltage is less than the second voltage.

Here, the first voltage transmission circuit 701 and the second voltage transmission circuit 702 are both connected to the same supply source of the first voltage, and the supply source of the first voltage (a first voltage generator) will be described in detail in subsequent examples. The second voltage transmission circuit 702 here is controlled by a signal Rrefresh_ctl related to the refresh operation. During the refresh operation of the memory, the second voltage transmission circuit 702 is at least partially turned off through Rrefresh_ctl, so as to at least partially cut off a transmission path of the first voltage, thereby facilitating to limit the current at the first voltage during the refresh operation.

It is to be noted that the second voltage transmission circuit 702 may comprise a plurality of parallel branches controlled by Rrefresh_ctl, and the purpose of limiting the current at the first voltage during the refresh operation may be achieved by turning off at least part of the branches.

In some examples, the peripheral circuit of the memory is further configured to: during a read or write operation on a memory cell coupled with one selected word line in the plurality of word lines, apply the first voltage to an unselected word line adjacent to the selected word line by turning on the first voltage transmission circuit 701 and turning on the second voltage transmission circuit 702.

It may be understood that the second voltage transmission circuit 702 remains at an on state during the read or write operation of the memory, and is at least partially off during the refresh operation of the memory. That is, the second voltage transmission circuit 702 here is the driving path mentioned above that is closed only during the refresh operation. The first voltage transmission circuit 701 remains at the on state during the read, write, and refresh operations of the memory. As such, it may be ensured that by the first voltage, a coupling reduction effect in the read and write operations is achieved, the row hammer problem is alleviated, and the current during the refresh operation may be reduced as well.

In some examples, the peripheral circuit of the memory is further configured to: start to apply a precharge voltage to the selected word line at a first timing; start to float the selected word line at a third timing after the first timing; apply the first voltage to the unselected word line adjacent to the selected word line in a first period before the first timing, and apply a second voltage to the unselected word line adjacent to the selected word line in a second period after the first timing and before the third timing, wherein the first voltage and the second voltage are both negative voltages, and the first voltage is less than the second voltage.

Here, as shown in FIG. 8, during each of the read, write, and refresh operations of the memory, the selected word line may be activated, that is, the respective first timing T1 is present during each operation, and the selected word line may be deactivated, that is, the respective third timing T3 is present during each operation. On that basis, the respective first period P1 and second period P2 are also present during each of the read, write, and refresh operations. Moreover, the lower first voltage (vneg2) is applied in the first period P1, so as to pull down, before applying the precharge voltage, the starting voltage on the unselected word line adjacent to the selected word line that will be increased by the precharge voltage due to the coupling; the second voltage (vneg1) is applied in the second time period P2, so as to pull up, before floating the selected word line, the starting voltage on the unselected word line adjacent to the selected word line that will be decreased by floating coupling, resulting in obtaining a smaller coupling voltage difference ΔV2.

It is to be noted that both the first voltage and the second voltage may be applied in a period between the first period and the second period. It is better to start to apply the second voltage after a coupling boost on the unselected word line adjacent to the selected word line is completed and a decrease has lasted for a duration, so as to avoid superposing a voltage boost caused by boosting the first voltage to the second voltage onto the coupling boost. In addition, the second voltage may be maintained on the unselected word line adjacent to the selected word line both before the first period and after the second period.

In some examples, the peripheral circuit of the memory comprises: the first voltage transmission circuit 701 coupled with a word-line driver circuit and configured to: apply the first voltage to the word-line driver circuit in the first period during read, write, and refresh operations; the second voltage transmission circuit 702 coupled with the word-line driver circuit and configured to: apply the first voltage to the word-line driver circuit in the first period during read and write operations; and disconnect the application of the first voltage to the word-line driver circuit in the first period during the refresh operation; a third voltage transmission circuit 703 coupled with the word-line driver circuit and configured to: apply the second voltage to the word-line driver circuit in the second period during the read, write, and refresh operations; and the word-line driver circuit 704 configured to: during the read, write, and refresh operations, apply the received precharge voltage to the selected word line, and apply a voltage received from the first voltage transmission circuit, the second voltage transmission circuit, or the third voltage transmission circuit to the unselected word line adjacent to the selected word line.

Here, on/off conditions of the first voltage transmission circuit 701/the third voltage transmission circuit 703 are the same in first periods/second periods during the read, write, and refresh operations; and on/off conditions of the second voltage transmission circuit 702 are different in the first periods during the read, write, and refresh operations.

In some examples, as shown in FIG. 8, the word-line driver circuit 704 is configured to: at the second timing T2 before the first timing T1, change the voltage applied to the unselected word line adjacent to the selected word line from the second voltage (vneg1) to the first voltage (vneg2); and at the fourth timing T4 before the third timing T3 and after the first timing T1, change the voltage applied to the unselected word line adjacent to the selected word line from the first voltage to the second voltage. At the seventh timing T7 after a certain buffer time following the third timing T3, the voltage on the select word line starts to decrease from the precharge voltage to the second voltage (vneg1). At this time, the voltage on the unselected word line adjacent to the selected word line decreases temporarily with the selected word line due to the coupling effect, and then quickly stabilizes at the second voltage (vneg1) again.

Here, a voltage change with timing may be understood with reference to FIG. 6. At the fifth timing T5, the voltage on the adjacent non-select word line reaches the first voltage (vneg2), and the duration between the second timing T2 and the fifth timing T5 is the first duration ΔT1. At the sixth timing T6, the voltage on the adjacent non-select word line reaches the second voltage (vneg1), and the duration between the fourth timing T4 and the sixth timing T6 is the second duration ΔT2. The time difference between the first timing T1 and the second timing T2 is greater than or equal to the first duration ΔT1; and the time difference between the third timing T3 and the fourth timing T4 is greater than or equal to the second duration ΔT2. Moreover, the fourth timing is better to be after the coupling boost on the unselected word line adjacent to the selected word line is completed and the decreases has lasted for a duration, so as to avoid superposing the voltage boost caused by boosting the first voltage to the second voltage onto the coupling boost.

In some examples, the first voltage transmission circuit 701 is configured to apply the first voltage to the word-line driver circuit 704 at the second timing in response to a second control signal being in a valid state; the second voltage transmission circuit 702 is configured to apply the first voltage to the word-line driver circuit 704 at the second timing in response to a refresh control signal being in an invalid state; and disconnect the application of the first voltage to the word-line driver circuit 704 at the second timing in response to the refresh control signal being in a valid state; and the third voltage transmission circuit 703 is configured to apply the second voltage to the word-line driver circuit 704 at the fourth timing in response to a first control signal being in a valid state.

Here, a state of the refresh control signal is to indicate an on or off state of the second voltage transmission circuit at the second timing. It is to be noted that an interval in which the refresh control signal here is in the valid state is required to be included in an interval in which the first voltage is applied to the unselected word line adjacent to the selected word line. That is, a timing when the valid state of the refresh control signal starts is required to be no later than a timing (T2) when the application of the first voltage to the unselected word line adjacent to the selected word line starts, and the end of the valid state of the refresh control signal is required to be no earlier than a timing (T4) when the application of the first voltage to the unselected word line adjacent to the selected word line stops. As such, the current may be limited in the application of the first voltage having a larger absolute value during the refresh operation of the memory.

In some examples, the refresh control signal may be generated directly based on a refresh activation command for the refresh operation of the memory, and a portion of the generated refresh control signal that is beyond the interval for the application of the first voltage to the unselected word line adjacent to the selected word line doesn't take an effect due to the second control signal being in the invalid state. It may be understood that the use of the refresh activation command to generate the refresh control signal here may save signaling and related circuits, thereby reducing the power consumption and saving costs. In some examples, the first voltage transmission circuit 701 is configured to apply the first voltage to the word-line driver circuit 704 at the second timing T2 in response to the second control signal being in the valid state and a word line select signal being in a valid state; and the second voltage transmission circuit 702 is configured to apply the first voltage to the word-line driver circuit 704 at the second timing in response to the refresh control signal being in the invalid state, the second control signal being in the valid state, and the word line select signal being in the valid state.

Here, the first voltage transmission circuit 701 is controlled by the second control signal and the word line select signal jointly, and the first voltage transmission circuit 701 is on when both are in the valid state. The refresh control signal is added for the second voltage transmission circuit 702 besides various control signals of the first voltage transmission circuit, so as to use the refresh control signal to differentiate between the impacts of the refresh operation on the on and off of the second voltage transmission circuit 702. It is to be noted that Rrefresh_ctl in FIG. 7*a* and Refresh_en_n in FIG. 7*b* are both refresh control signals in essence. In some examples, the third voltage transmission circuit 703 may comprise one or more first transistors controlled by the first control signal wlup_enb, and a plurality of first transistors may be connected in parallel to form a first transistor group.

In some examples, as shown in FIG. 7*b*, the third voltage transmission circuit 703 comprises the first transistor group, and the first transistor group comprises a plurality of first transistors M1 (only one first transistor is shown in FIG. 7*b*), each first transistor M1 having a first end receiving the first control signal wlup_enb, a second end receiving the second voltage (vneg1), and a third end connected with the word-line driver circuit.

As such, the plurality of transistors may realize shunting of each transistor, so that a current flowing through each transistor may be reduced. At the same time, compared with the case where a single transistor may be damaged, the plurality of transistors may realize more reliable on/off control.

In some examples, the first voltage transmission circuit 701 may comprise one or more second transistors controlled by the second control signal wlup_vneg2 and one or more third transistors controlled by the word line select signal wld<n>, the second transistor and the third transistor being connected in series, the plurality of second transistors being connected in parallel, and the plurality of the third transistors being connected in parallel.

In some examples, as shown in FIG. 7*b*, the first voltage transmission circuit 701 comprises a second transistor group and a third transistor group. The second transistor group comprises a plurality of second transistors M2 (only one second transistor is shown in FIG. 7*b*), each second transistor M2 having a first end receiving the second control signal wlup_vneg2, a second end connected with a third transistor M3, and a third end connected with the word-line driver circuit. The third transistor group comprises a plurality of third transistors M3 (only one third transistor is shown in FIG. 7*b*), each third transistor M3 having a first end receiving the word line select signal wld<n>, a second end receiving the first voltage, and a third end connected with the second transistor M2. The second voltage transmission circuit 702 comprises a fourth transistor group, a fifth transistor group, and a sixth transistor group. The fourth transistor group comprises a plurality of fourth transistors M4, each fourth transistor M4 having a first end receiving the refresh activation signal, a second end connected with a fifth transistor, and a third end connected with the word-line driver circuit. The fifth transistor group comprises a plurality of fifth transistors M5, each fifth transistor M5 having a first end receiving the second control signal wlup_vneg2, a second end connected with a sixth transistor M6, and a third end connected with the fourth transistor M4. The sixth transistor group comprises a plurality of sixth transistors M6, each sixth transistor M6 having a first end receiving the word line select signal wld<n>, a second end receiving the first voltage, and a third end connected with the fifth transistor M5.

In some examples, as shown in FIG. 7*b*, the first transistor M1, the second transistor M2, the third transistor M3, the fourth transistor M4, the fifth transistor M5, and the sixth transistor M6 are each of the type of an N-type channel field effect MOS transistor. The first transistor M1, the second transistor M2, the third transistor M3, the fourth transistor M4, the fifth transistor M5, and the sixth transistor M6 each have a first end which is a gate, a second end which is a source, and a third end which is a drain.

In some examples, the current control may be realized through at least one of the number of transistors or a width-to-length ratio of the transistors in the first voltage transmission circuit 701 and the second voltage transmission circuit 702.

In some examples, for simplicity of the control, the number of the second transistors is set to be the same as the number of the third transistors; the number of the fourth transistors, the number of the fifth transistors, and the number of the sixth transistors are set to be the same, and width-to-length ratios of the second transistor to the sixth transistor are all set to be the same. As such, the current control may be realized by controlling the first number and the second number.

In some examples, as shown in FIG. 7*b*, the second transistor group and the third transistor group each comprise the first number N1 of transistors, and the fourth transistor group, the fifth transistor group, and the sixth transistor group each comprise the second number N2 of transistors; the first number of second transistors M2, the first number of third transistors M3, the second number of fourth transistors M4, the second number of fifth transistors M5, and the second number of sixth transistors M6 are each in a parallel cascade relationship; and the first number N1 is greater than or equal to the second number N2.

In an example, with reference to FIG. 7*b* in conjunction with above FIG. 5, in FIG. 5, the voltage transmission circuit between the word-line driver circuit and the first voltage mainly comprises one part in which the number of the second transistors and the number of the third transistors are a+b. In FIG. 7*b*, the voltage transmission circuit between the word-line driver circuit and the first voltage comprises two parts, wherein one part corresponds to the first voltage transmission circuit 701, in which the number of the second transistors M2 and the number of the third transistors M3 are both a, and the other part corresponds to the second voltage transmission circuit 702, in which the number of the fourth transistors M4, the number of the fifth transistors M5, and the number of the sixth transistors M6 are all b. In FIG. 7*b*, the second transistors M2 and the fifth transistors M5 are all controlled by the second control signal wlup_vneg2, and a sum of their numbers is a+b; and the third transistors M3 and the sixth transistors M6 are all controlled by the word line select signal wld<n>, and a sum of their numbers is a+b. Here, a and b may be chosen according to actual situations.

During the read or write operation of the memory, in the implementation corresponding to FIG. 7*b*, the first voltage transmission circuit 701 and the second voltage transmission circuit 702 are both on. At this time, a conductive path corresponding to the first voltage is substantially the same as a conductive path corresponding to the first voltage in the implementation corresponding to FIG. 5. That is, the read or write operation is substantially unaffected, and more particularly, decrease slopes of the voltage on the unselected word line adjacent to the selected word line decreasing from the second voltage to the first voltage are substantially the same. During the refresh operation of the memory, in the implementation corresponding to FIG. 7*b*, the first voltage transmission circuit 701 is on and the second voltage transmission circuit 702 is off. At this time, conductive paths corresponding to the first voltage are less than corresponding conductive paths during the read or write operation of the memory, so that the refresh current is controlled.

As described above, the change processes of the voltages on the selected word line and the unselected word line adjacent to the selected word line in each period in FIG. 8 may be understood with reference to the change processes of the voltages on the selected word line and the unselected word line adjacent to the selected word line in each period in FIG. 6. There is a slight difference in the refresh operation between FIG. 8 and FIG. 6, and that difference is detailed in the following descriptions of FIG. 9*a* and FIG. 9*b*.

Figure 9A:
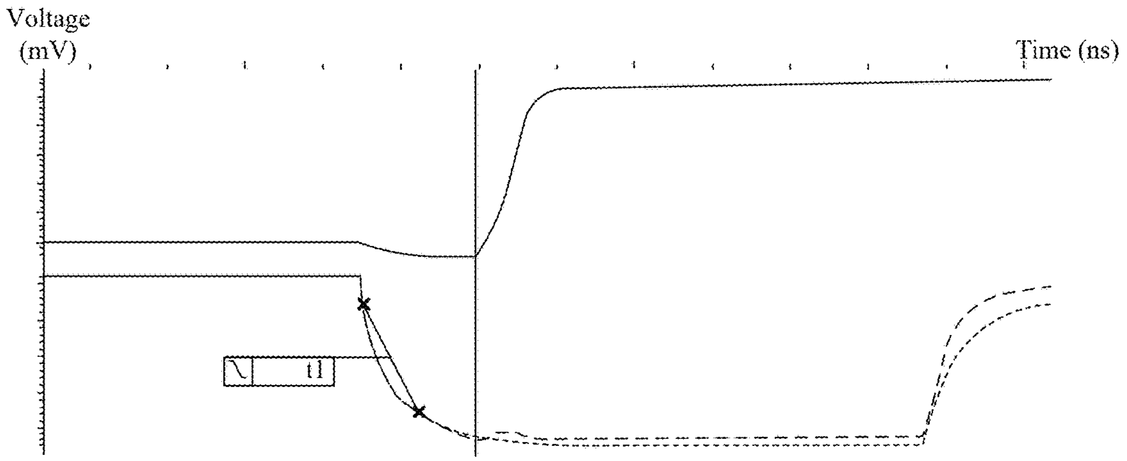
FIG. 9*a* is a schematic diagram I of voltage timings on a selected word line and an unselected word line adjacent to the selected word line during a refresh operation of the example memory according to an example of the present disclosure.
Figure 9B:
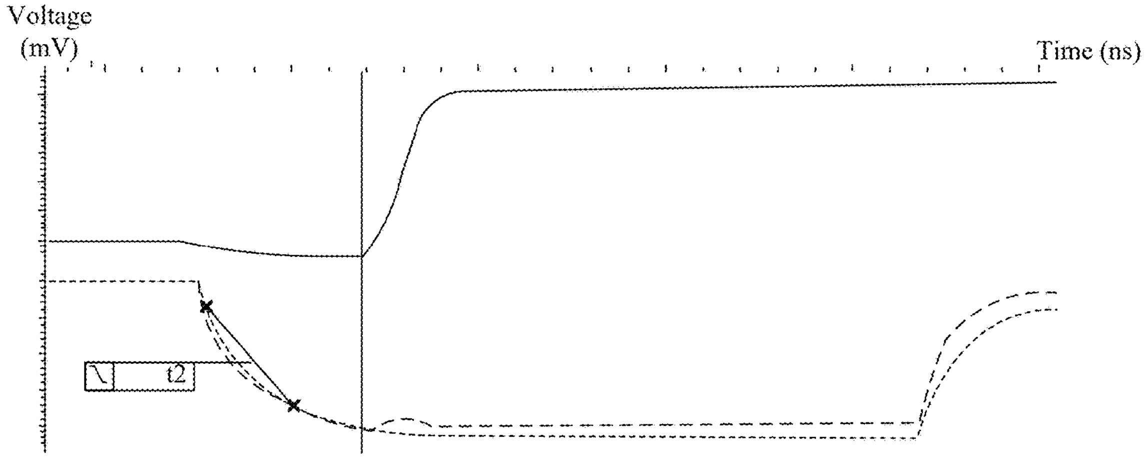
FIG. 9*b* is a schematic diagram II of the voltage timings on the selected word line and the unselected word line adjacent to the selected word line during the refresh operation of the example memory according to an example of the present disclosure.

FIG. 9*a* is a schematic diagram of voltage timings on the selected word line and the unselected word line adjacent to the selected word line during the refresh operation of the memory in the implementation corresponding to FIG. 5 and FIG. 6. FIG. 9*b* is a schematic diagram of voltage timings on the selected word line and the unselected word line adjacent to the selected word line during the refresh operation of the memory in the implementation corresponding to FIG. 7*b* and FIG. 8. In FIG. 9*a* and FIG. 9*b*, a vertical coordinate is a voltage in unit of millivolts (mV), and a horizontal coordinate is time in unit of nanoseconds (ns). In FIG. 9*a* and FIG. 9*b*, an upper curve is a voltage-time curve of the selected word line before and after applying the precharge voltage, and a lower curve is a voltage-time curve of the voltage on the unselected word line adjacent to the selected word line before and after the change from the second voltage (vneg1) to the first voltage (vneg2). In order to make a process in which the voltage changes from the second voltage to the first voltage in the lower curve clearer, in FIG. 9*a* and FIG. 9*b*, a voltage value represented by each cell of the vertical coordinate of the lower curve is less than a voltage value represented by each cell of the vertical coordinate of the upper curve.

Since the second voltage transmission circuit 702 is off, a core duration t2 (945 picoseconds (ps)) of the voltage change on the unselected word line adjacent to the selected word line from the second voltage (vneg1) to the first voltage (vneg2) during the refresh operation of the memory in the implementation corresponding to FIG. 7*b* as shown in FIG. 9*b* is slightly longer than a core duration t1 (720 ps) of the voltage change on the unselected word line adjacent to the selected word line from the second voltage (vneg1) to the first voltage (vneg2) during the refresh operation of the memory in the implementation corresponding to FIG. 5 as shown in FIG. 9*a*, i.e., the stabilization consumes slightly longer time. On that basis, compared with the implementation corresponding to FIG. 5, in the implementation corresponding to FIG. 7*b*, the timing T2 when the application of the first voltage to the unselected word line adjacent to the selected word line starts may be slightly advanced as appropriate.

It may be understood that when the ratio of the first number N1 to the second number N2 is larger, current limitation effect in the refresh operation is more obvious. When the ratio of the first number N1 to the second number N2 is smaller, time for the voltage on the unselected word line adjacent to the selected word line to decrease from the second voltage to the first voltage in the refresh operation is longer. Accordingly, it is required to seek for a balance.

In some examples, the ratio of the first number N1 to the second number N2 ranges from 9:3 to 1:1. In an example, the ratio of the first number N1 to the second number N2 may be 9:3, 8:3, 7:3, 1:1, etc.

Figure 10A:
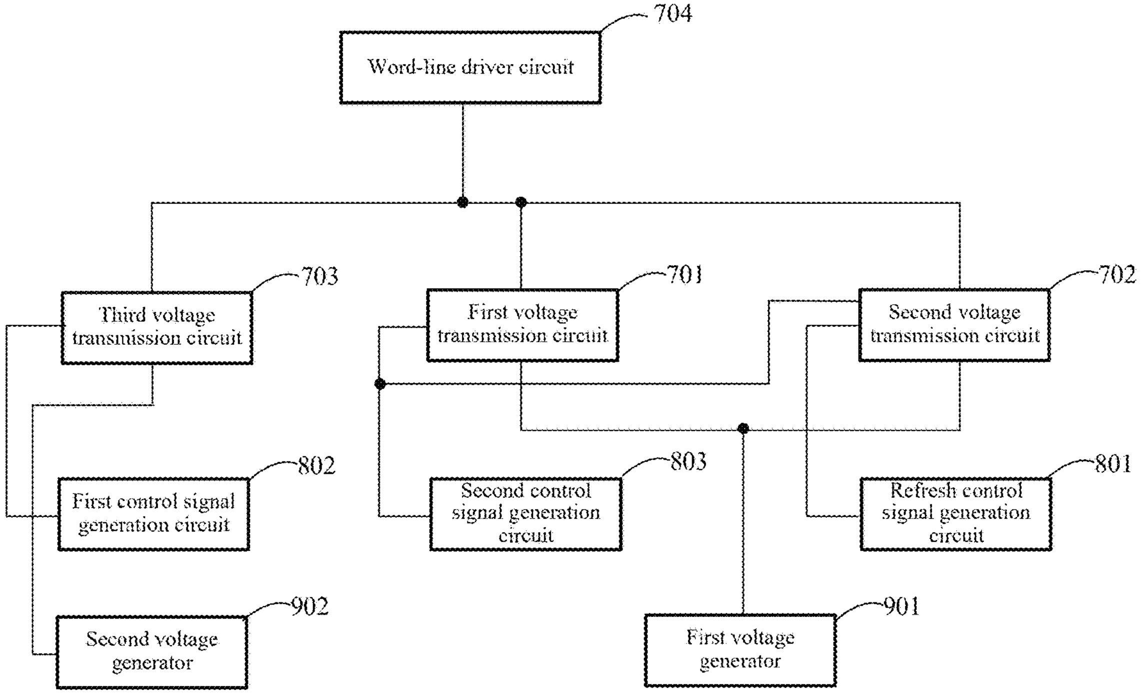
FIG. 10*a* is a schematic diagram I of a local structure of an example peripheral circuit according to an example of the present disclosure.
Figure 10B:
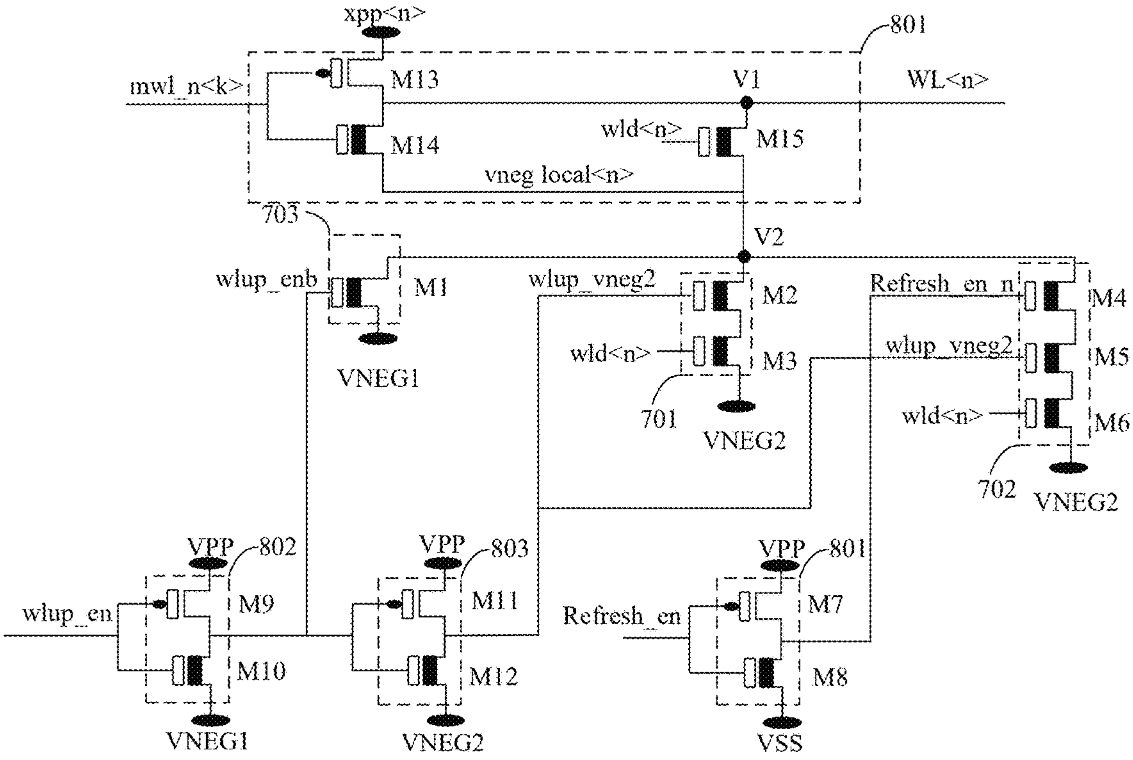
FIG. 10*b* is a schematic diagram II of the local structure of the example peripheral circuit according to an example of the present disclosure.

FIG. 10*a* is a schematic diagram I of a local structure of an example peripheral circuit according to an example of the present disclosure. FIG. 10*b* is a schematic diagram II of the local structure of the example peripheral circuit according to an example of the present disclosure.

In some examples, as shown in FIG. 10*a*, the peripheral circuit further comprises: a refresh control signal generation circuit 801 coupled with the second voltage transmission circuit 702 and configured to: receive the precharge voltage, a ground voltage, and the refresh activation signal, and generate the refresh control signal according to the refresh activation signal, wherein the refresh activation signal being in a valid state indicates performing the refresh operation on the selected word line; a first control signal generation circuit 802 coupled with the third voltage transmission circuit 703 and configured to: receive the precharge voltage, the second voltage, and an enable control signal, and generate the first control signal according to the enable control signal, wherein the enable control signal being in a valid state indicates switching the word line select signal to the valid state; and a second control signal generation circuit 803 coupled with both the first voltage transmission circuit 701 and the second voltage transmission circuit 702 and configured to: receive the precharge voltage, the first voltage, and the first control signal, and generate the second control signal according to the first control signal.

Here, the refresh control signal generation circuit 801, the first control signal generation circuit 802 and the second control signal generation circuit 803 may also be interpreted as voltage conversion circuits. These voltage conversion circuits respectively convert the refresh activation signal into a refresh control signal with a high-level voltage matching the precharge voltage and a low-level voltage matching the ground voltage, convert the enable control signal into the first control signal with a high-level voltage matching the precharge voltage and a low-level voltage matching the second voltage, and convert the first control signal into the second control signal with a high-level voltage matching the precharge voltage and a low-level voltage matching the first voltage.

It is to be noted that selected word line may comprise a plurality of word lines during a refresh operation.

In some examples, as shown in FIG. 10*b*, the refresh control signal generation circuit 801 comprises a seventh transistor M7 and an eighth transistor M8. The seventh transistor M7 has a first end receiving the refresh activation signal Refresh_en, a second end connected with the eighth transistor M8, and a third end receiving the precharge voltage Vpp. The eighth transistor M8 has a first end receiving the refresh activation signal Refresh_en, a second end receiving the ground voltage VSS, and a third end connected with the seventh transistor M7.

In some examples, as shown in FIG. 10*b*, the first control signal generation circuit 802 comprises a ninth transistor M9 and a tenth transistor M10. The ninth transistor M9 has a first end receiving the enable control signal wlup_en, a second end connected with the tenth transistor M10, and a third end receiving the precharge voltage Vpp. The tenth transistor M10 has a first end receiving the enable control signal wlup_en, a second end receiving the second voltage VNEG1, and a third end connected with the ninth transistor M9 and generating the first control signal wlup_enb.

In some examples, as shown in FIG. 10*b*, the second control signal generation circuit 803 comprises an eleventh transistor M11 and a twelfth transistor M12. The eleventh transistor M11 has a first end receiving the first control signal wlup_enb, a second end connected with the twelfth transistor M12, and a third end receiving the precharge voltage Vpp. The twelfth transistor M12 has a first end receiving the first control signal wlup_enb, a second end receiving the first voltage VNEG2, and a third end connected with the eleventh transistor M11 and generating the second control signal wlup_vneg2.

In some examples, as shown in FIG. 10*b*, the seventh transistor M7, the ninth transistor M9, and the eleventh transistor M11 are each of the type of a P-type channel field effect MOS transistor; and the eighth transistor M8, the tenth transistor M10, and the twelfth transistor M12 are each of the type of an N-type channel field effect MOS transistor.

In some examples, as shown in FIG. 10*b*, the seventh transistor M7, the eighth transistor M8, the ninth transistor M9, the tenth transistor M10, the eleventh transistor M11, and the twelfth transistor M12 each have a first end which is a gate, a second end which is a source, and a third end which is a drain.

In some examples, as shown in FIG. 10*b*, the peripheral circuit further comprises: a first voltage generator 901 coupled with the first voltage transmission circuit 701 and the second voltage transmission circuit 702 and configured to generate the first voltage; and a second voltage generator 902 coupled with the third voltage transmission circuit 703 and configured to generate the second voltage.

In some examples, the first voltage generator 901 and the second voltage generator 902 may belong to voltage generators of the peripheral circuit. In some examples, the first voltage generator 901 and the second voltage generator 902 may each comprise a charge pump. The first voltage generator 901 and the second voltage generator 902 may be integrated on a single charge pump with a plurality of outputs, or may belong to different charge pumps.

In some examples, there are a plurality of word-line driver circuits; the plurality of word-line driver circuits are disposed in one-to-one correspondence with the plurality of word lines; the word-line driver circuit is configured to: receive a main word line select signal, the word line select signal, and a precharge control signal, apply the received precharge voltage to the selected word line between the first timing and the third timing, apply the first voltage to the unselected word line adjacent to the selected word line between the second timing and the fourth timing, and apply the second voltage to the unselected word line adjacent to the selected word line before the second timing and after the fourth timing, wherein the main word line select signal being in a valid state indicates selecting one of a plurality of main word lines of the peripheral circuit, each main word line corresponding to a plurality of word lines; the word line select signal being in a valid state indicates selecting one of the plurality of word lines corresponding to the main word line; and the precharge control signal being in a valid state indicates applying the precharge voltage to the selected word line.

In some examples, the plurality of word-line driver circuits 704 are divided into a plurality of groups, each group of word-line driver circuits 704 corresponding to one first voltage generator 901, one second voltage generator 902, one first voltage transmission circuit 701, one second voltage transmission circuit 702, and one third voltage transmission circuit 703.

Here, the word-line driver circuit 704 is configured to cause the adjacent non-select word line to be connected with the second voltage at the first timing T1 and cause the adjacent non-select word line to be connected with the first voltage at the second timing T2, in response to the main word line select signal mwl_n<k>, the word line select signal wld<n>, and the precharge control signal xpp<n>. The main word line select signal mwl_n<k> is to indicate selecting one of the plurality of main word lines of the peripheral circuit, each main word line corresponding to a plurality of word lines. The word line select signal wld<n> is to indicate selecting one of the plurality of word lines corresponding to the main word line. The precharge control signal xpp<n> is to indicate supplying the precharge voltage Vpp to the select word line.

It is to be noted that the word line may be selected under a joint action of the main word line select signal mwl_n<k> and the word line select signal wld<n>. Each word line corresponds to one word-line driver circuit. The plurality of word-line driver circuits corresponding to the plurality of word lines are divided into a plurality of groups according to different word line select signals wld<n>. Word line select signals wld<n> corresponding to all of the word lines in the same group are in the same level state, and main word line select signals mwl_n<k> corresponding to select or non-select word lines in the same group are in different level states.

In an example, one memory block comprises 16 word lines WL0 to WL15 which share one control signal generation circuit, and the 16 word lines correspond to 4 main word lines GWL0-GWL3. The 16 word lines are divided into 4 groups, a first group comprising WL0-WL3, a second group comprising WL4-WL7, a third group comprising WL8-WL11, and a fourth group comprising WL12-WL15. The main word line GWL0 corresponds to a first word line in each group of word lines, i.e., WL0, WL4, WL8, and WL12; the main word line GWL1 corresponds to a second word line in each group of word lines, i.e., WL1, WL5, WL9, and WL13; the main word line GWL2 corresponds to a third word line in each group of word lines, i.e., WL2, WL6, WL10, and WL14; and the main word line GWL3 corresponds to a fourth word line in each group of word lines, i.e., WL3, WL7, WL11, and WL15.

The 16 word lines in the memory block correspond to 16 word-line driver circuits, and the 16 word-line driver circuits corresponding to the four groups of word lines are divided into 4 groups, each group sharing the same first voltage generator, the same second voltage generator, the same first voltage transmission circuit, the same second voltage transmission circuit, and the same third voltage transmission circuit. That is, the word-line driver circuits corresponding to the 16 word lines are divided into 4 groups which are connected with 4 first voltage transmission circuits, 4 second voltage transmission circuits, and 4 third voltage transmission circuits respectively. Every 4 word lines are connected to the same first voltage transmission circuit, the same second voltage transmission circuit, and the same third voltage transmission circuit. The 4 word-line driver circuits in one group are all connected with the same first voltage transmission circuit, the same second voltage transmission circuit, and the same third voltage transmission circuit through a second node V2 shown in FIG. 10*b*. The word line select signals wld<n> corresponding to the 4 word lines in the same group are all in the same level state, and the main word line select signals mwl_n<k> corresponding to select or non-select word lines in the same group are in different level states.

It is to be noted that numbers of the word lines and the main word lines in the memory block here are used only to illustrate a connection relationship between the circuits, and is not intended to limit actual numbers of word lines and main word lines contained in the memory block in the examples of the present disclosure.

In some other examples, it is possible that each word-line driver circuit may correspond to one first voltage generator 901, one second voltage generator 902, one first voltage transmission circuit 701, one second voltage transmission circuit 702, and one third voltage transmission circuit 703. It may be understood that a plurality of word-line driver circuits in each group of word-line driver circuits share one first voltage generator, one second voltage generator, one first voltage transmission circuit, one second voltage transmission circuit, and one third voltage transmission circuit, thereby greatly reducing a circuit area.

In some examples, as shown in FIG. 10*b*, the word-line driver circuit 704 comprises: a thirteenth transistor M13, a fourteenth transistor M14, and a fifteenth transistor M15. The thirteenth transistor M13 has a first end receiving the main word line select signal mwl_n<k>, a second end receiving the precharge control signal xpp<n>, and a third end connected with the plurality of word lines WL<n> corresponding to the main word line through a first node V1. The fourteenth transistor M14 has a first end receiving the main word line select signal mwl_n<k>, a second end connected with the plurality of word lines WL<n> corresponding to the main word line through the first node V1, and a third end connected with each of the voltage transmission circuits, i.e., the first voltage transmission circuit 701, the second voltage transmission circuit 702, and the third voltage transmission circuit 703, through the second node V2. The fifteenth transistor M15 has a first end receiving the word line select signal wld<n>, a second end connected with the plurality of word lines WL<n> corresponding to the main word line through the first node V1, and a third end connected with each of the voltage transmission circuits, i.e., the first voltage transmission circuit 701, the second voltage transmission circuit 702, and the third voltage transmission circuit 703, through the second node V2.

In some examples, as shown in FIG. 10*b*, the thirteenth transistor M13 is of the type of a P-type channel field effect MOS transistor; the fourteenth transistor M14 and the fifteenth transistor M15 are each of the type of an N-type channel field effect MOS transistor. The thirteenth transistor M13, the fourteenth transistor M14, and the fifteenth transistor M15 each have a first end which is a gate, a second end which is a source, and a third end which is a drain.

It is to be noted that only the word-line driver circuit corresponding to one word line is shown in FIG. 10*a* and FIG. 10*b*. In practice, each word line is provided with its corresponding word-line driver circuit.

In the examples of the present disclosure, the precharge voltage is a high-level voltage; the first voltage and the second voltage are both negative voltages. In an example, the precharge voltage Vpp has a voltage magnitude range of 2.2 V to 2.8 V, the first voltage VNEG2 has a voltage magnitude range of −0.9 V to −0.7 V, for example, −0.8 V, and the second voltage VNEG1 has a voltage magnitude range of −0.6 V to −0.4 V, for example, −0.5 V.

As mentioned above, as the memory size decreases, a physical distance between the word lines further decreases, and the row hammer may affect not only the word line of an adjacent row, but may even affect a word line of a nearby row (two or even more rows apart).

On that basis, in some examples, when the select word line is an $N^{th}$ word line, adjacent non-select word line comprises at least an (N−1)th word line and an (N+1)th word line.

In some examples, the adjacent non-select word line further comprises a word line spaced apart from the select word line by M word lines, wherein M is a natural number, and 1≤M≤4.

Here, M may be determined according to a range of surrounding rows affected by the row hammer in practical application.

In an example, when the select word line is a 6th word line, the adjacent non-select word line comprises a 5th word line and a 7th word line. The adjacent non-select word line may further comprise a 4th word line and an 8th word line, a 3rd word line and a 9th word line, and a 2nd word line and a 10th word line.

It is to be noted that when the adjacent non-select word line comprises a plurality of word lines, a respective voltage is required to be applied to each word line in accordance with the timing as required in the examples of the present disclosure.

In some examples, for each of the plurality of adjacent non-select word lines, voltages on the adjacent non-select word lines may be reduced in advance from the second voltage to the same first voltage before the beginning of rise coupling, and voltages on the adjacent non-select word lines may be increased in advance from the first voltage to the same second voltage before the beginning of fall coupling.

In some other examples, for each of the plurality of adjacent non-select word lines, voltages on the adjacent non-select word lines may be reduced in advance from the second voltage to different first voltages before the beginning of rise coupling, and voltages on the adjacent non-select word lines may be increased in advance from the first voltage to different second voltages before the beginning of fall coupling. Here, an adjustment value between the different first voltages and an adjustment value between the different second voltages may be determined according to a distance between each adjacent non-select word line and the select word line. In an example, when the distance is smaller, the coupling effect is stronger, an absolute value of a difference of the second voltage with respect to the first voltage is larger, and an absolute value of a difference of the first voltage with respect to the second voltage is larger; whereas when the distance is larger, the coupling effect is weaker, the absolute value of the difference of the second voltage with respect to the first voltage is smaller, and the absolute value of the difference of the first voltage with respect to the second voltage is smaller.

It may be understood that the absolute value of the voltage difference between the first voltage and the second voltage decreases as the distance between the adjacent non-select word line and the select word line increases. In an example, when the distance between the select word line and the adjacent non-select word line is larger, a capacitance between the select word line and the adjacent non-select word line is smaller, a coupling coefficient r is smaller, and the impact of the select word line on the adjacent non-select word line is weaker. Therefore, a smaller absolute value of the voltage difference between the first voltage and the second voltage may avoid interference of the select word line on the adjacent non-select word line.

Due to the alleviation of the row hammer problem, the refresh frequency of the memory due to the row hammer problem may be reduced to some extent, the power of the memory may be reduced to some extent, and thus the complexity of the peripheral circuit of the memory may also be reduced with the reduction of the power.

Figure 11A:
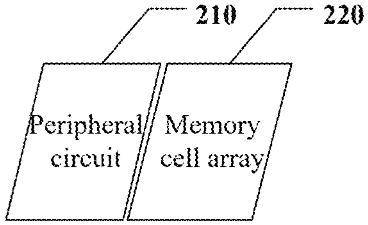
FIG. 11*a* is a schematic diagram I of an arrangement of a memory cell array and a peripheral circuit in the example memory according to an example of the present disclosure.
Figure 11B:
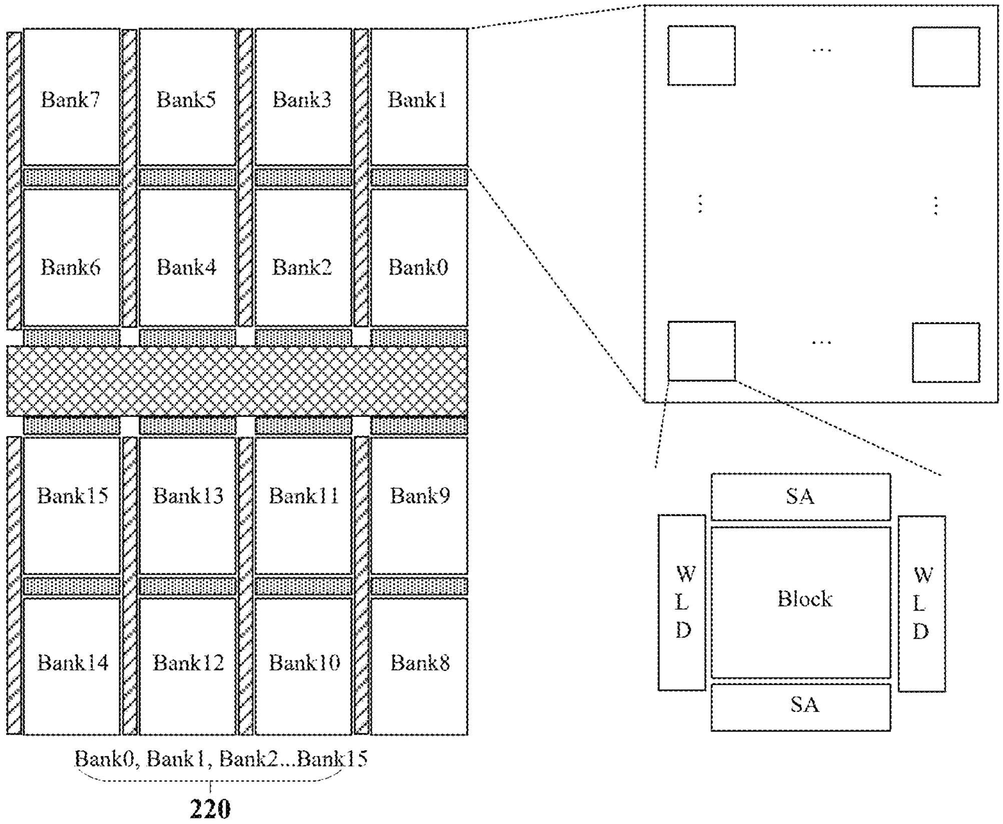
FIG. 11*b* is a top view I of an arrangement of the memory cell array and the peripheral circuit in the example memory according to an example of the present disclosure.

FIG. 11*a* is a schematic diagram I of an arrangement of the memory cell array and the peripheral circuit in the example memory according to the examples of the present disclosure. FIG. 11*b* is a top view I of an arrangement of the memory cell array and the peripheral circuit in the example memory according to the examples of the present disclosure.

As shown in FIG. 11*a*, the memory cell array 220 and the peripheral circuit 210 are disposed in juxtaposition. In an example, the memory cell array comprises M memory banks, each memory bank comprising N memory blocks, each memory block being provided with a control circuit corresponding to the memory block on at least one side thereof, and each memory bank being provided with a control circuit corresponding to the memory bank on at least one side thereof. Every K memory banks in the M memory banks form a memory bank row, the M memory banks form M/K memory bank rows. The peripheral circuit corresponding to all the memory banks is disposed between two memory bank rows in the middle. It is to be noted that M, N, and K here are all positive integers, and M is an integer multiple of K.

In an example, as shown in FIG. 11*b*, the memory cell array 220 comprises 16 memory banks Bank0-Bank15, each memory bank comprising a plurality of memory blocks Block, each memory block Block being provided with corresponding SAs and WLDs opposite each other around the memory block, and each memory bank being provided with a column decoder and a row decoder corresponding to the memory bank on two sides thereof. Every 4 memory banks form a memory bank row, and the 16 memory banks form 4 memory bank rows. A control circuit corresponding to all the memory banks is disposed between two memory bank rows in the middle. It is to be noted that the number of the memory banks in FIG. 11*b* is exemplary only and is not intended to limit the number of memory banks in the memory in the present disclosure.

As mentioned above, the first voltage generator, the refresh control signal generation circuit, the second control signal generation circuit, the first voltage transmission circuit, and the second voltage transmission circuit, etc., are added in the examples of the present disclosure, in order to suppress the coupling effect and limit the refresh current. However, in an arrangement of the memory cell array and the peripheral circuit shown in FIG. 11*a* and FIG. 11*b*, there may be no free space for placing these newly added circuits. Considering that the area occupied by the memory cell array in the DRAM is larger than that occupied by the peripheral circuit, in some examples, the memory cell array in the DRAM and the peripheral circuit are disposed in a stack and electrically connected by bonding, and a semiconductor layer in which the peripheral circuit is located may have some free space, which can be used for placing the newly added circuits described above.

Figure 12A:
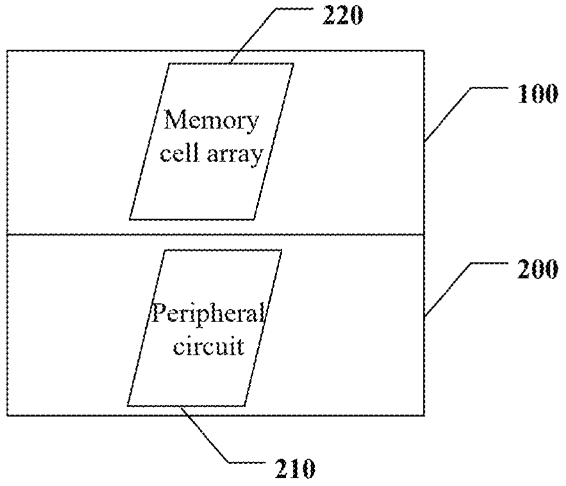
FIG. 12*a* is a schematic diagram II of an arrangement of the memory cell array and the peripheral circuit in the example memory according to an example of the present disclosure.
Figure 12B:
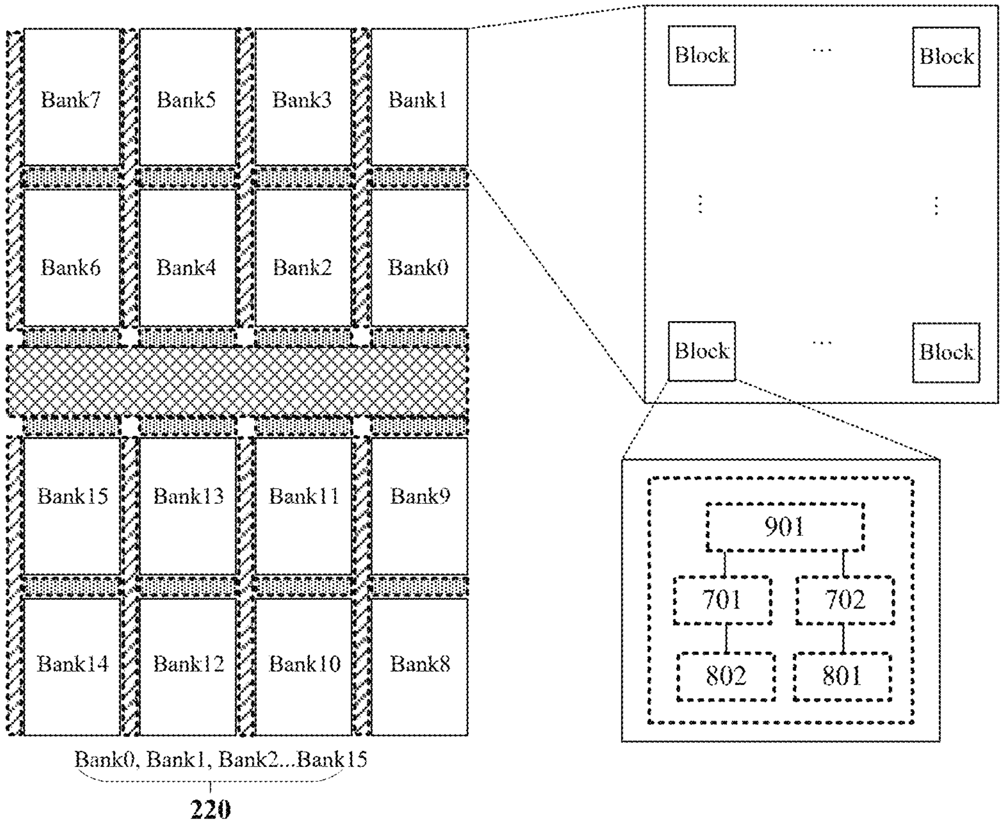
FIG. 12*b* is a top view II of an arrangement of the memory cell array and the peripheral circuit in the example memory according to an example of the present disclosure.

FIG. 12*a* is a schematic diagram II of an arrangement of the memory cell array and the peripheral circuit in the example memory of the present disclosure. FIG. 12*b* is a top view II of an arrangement of the memory cell array and the peripheral circuit in the example memory of the present disclosure.

In some examples, as shown in FIG. 12*a*, a first semiconductor structure 100 is located above a second semiconductor structure 200. In some other examples, the first semiconductor structure 100 is located below the second semiconductor structure 200. The first semiconductor structure 100 comprises the memory cell array 220, and the second semiconductor structure 200 comprises the peripheral circuit 210.

It is to be noted that the first semiconductor structure corresponding to FIG. 12*a* in FIG. 12*b* is located above the second semiconductor structure. A structure corresponding to a solid line in FIG. 12*b* is a structure located in the first semiconductor structure, and a structure corresponding to a dashed line is a structure located in the second semiconductor structure. A perspective view of the structure in the second semiconductor structure is provided for ease of understanding. That is, in an enlarged view corresponding to each memory block Block in FIG. 12*b*, the solid line indicates an enlarged portion of the memory block Block, and the dashed line indicates the structure in the second semiconductor structure at a position directly below the memory block Block.

In an example, as shown in FIG. 12*b*, the memory cell array 220 comprises 16 memory banks Bank0-Bank15, each memory bank comprising a plurality of memory blocks Block. The first voltage generator 901, the refresh control signal generation circuit 801, the second control signal generation circuit 802, the first voltage transmission circuit 701, and the second voltage transmission circuit 702 are disposed directly below each memory block Block.

It is to be noted that numbers of the first voltage generator 901, the refresh control signal generation circuit 801, the second control signal generation circuit 802, the first voltage transmission circuit 701, and the second voltage transmission circuit 702 in FIG. 12*b* are used as an example only, and are not intended to limit the number and position of a respective circuit in the memory of the present disclosure.

It is to be noted that in addition to the newly added circuits as described above, when the space is available, SA and WLD corresponding to each memory block may be disposed directly below this memory block, i.e., in the dashed line box shown in FIG. 9*b*.

In some examples, the memory cell array 220 is bonded with the peripheral circuit 210 via a bonding including, but not limited to, hybrid bonding, anodic bonding, melt bonding, transfer bonding, adhesive bonding, and eutectic bonding, etc.

When the memory employs a bonded stacking arrangement, the newly added circuits in the examples of the present disclosure and the related circuits such as SA and WLD may be placed under the array. Due to the stacking arrangement, the newly added circuits do not require additional area costs.

With the development of memories such as the DRAM, a process means is used to alleviate or eliminate the leakage induced by the row hammer. However, the process becomes increasingly larger in scale and has limited effects. Examples of the present disclosure can improve coupling effect between adjacent word lines by the design control, and reduce the refresh current, without increasing memory overheads.

Examples of the present disclosure further provide a memory, comprising: a plurality of word lines; a plurality of memory cells coupled with each word line; and a peripheral circuit coupled to the plurality of word lines, the peripheral circuit comprising a first voltage generator, a second voltage generator, a first voltage transmission circuit, a second voltage transmission circuit, a third voltage transmission circuit, and a plurality of word-line driver circuits, wherein the first voltage transmission circuit and the second voltage transmission circuit are connected in parallel between the first voltage generator and the plurality of word-line driver circuits, the third voltage transmission circuit is connected between the second voltage generator and the plurality of word-line driver circuits, and the plurality of word-line driver circuits are coupled with the plurality of word lines.

Here, the plurality of word-line driver circuits are disposed in one-to-one correspondence with the plurality of word lines respectively. There may be a plurality of the first voltage generators, a plurality of the second voltage generators, a plurality of the first voltage transmission circuits, a plurality of the second voltage transmission circuits, and a plurality of the third voltage transmission circuits. A connection relationship between these circuits may be understood with reference to the connection relationship of the circuits in the preceding examples.

In some examples, the peripheral circuit further comprises a refresh control signal generation circuit, a first control signal generation circuit, and a second control signal generation circuit, wherein the refresh control signal generation circuit is connected with the second voltage transmission circuit; the first control signal generation circuit is connected with the third voltage transmission circuit; and the second control signal generation circuit is connected with both the first voltage transmission circuit and the second voltage transmission circuit.

In some examples, the third voltage transmission circuit comprises a first transistor group, and the first transistor group comprises a plurality of first transistors, each first transistor having a first end connected with the first control signal generation circuit, a second end connected with the second voltage generator, and a third end connected with the word-line driver circuit.

In some examples, the first voltage transmission circuit comprises a second transistor group and a third transistor group; the second transistor group comprises a plurality of second transistors, each second transistor having a first end connected with the second control signal generation circuit, a second end connected with a third transistor, and a third end connected with the word-line driver circuit; the third transistor group comprises a plurality of third transistors, each third transistor having a first end receiving a word line select signal, a second end connected with the second voltage generator, and a third end connected with the second transistor; the second voltage transmission circuit comprises a fourth transistor group, a fifth transistor group, and a sixth transistor group; the fourth transistor group comprises a plurality of fourth transistors, each fourth transistor having a first end connected with the refresh control signal generation circuit, a second end connected with a fifth transistor, and a third end connected with the word-line driver circuit; the fifth transistor group comprises a plurality of fifth transistors, each fifth transistor having a first end connected with the second voltage generator, a second end connected with a sixth transistor, and a third end connected with the fourth transistor; and the sixth transistor group comprises a plurality of sixth transistors, each sixth transistor having a first end receiving the word line select signal, a second end receiving a first voltage, and a third end connected with the fifth transistor.

In some examples, the second transistor group and the third transistor group each comprise a first number of transistors, and the fourth transistor group, the fifth transistor group, and the sixth transistor group each comprise a second number of transistors; the first number of second transistors, the first number of third transistors, the second number of fourth transistors, the second number of fifth transistors, and the second number of sixth transistors are each in a parallel cascade relationship; and the first number is greater than or equal to the second number.

In some examples, the first transistor, the second transistor, the third transistor, the fourth transistor, the fifth transistor, and the sixth transistor are each of the type of an N-type channel field effect MOS transistor.

The first transistor, the second transistor, the third transistor, the fourth transistor, the fifth transistor and the sixth transistor each have a first end which is a gate, a second end which is a source, and a third end which is a drain.

In some examples, a ratio of the first number to the second number ranges from 9:3 to 1:1.

Here, the memory may be understood with reference to the memory in the preceding example of the present disclosure.

Examples of the present disclosure further provide a memory system, comprising: at least one memory as disclosed in the examples of the present disclosure; and a controller coupled to the memory and configured to control the memory.

Here, the memory may be understood with reference to the memory in the preceding example of the present disclosure. An internal configuration of the memory system may be understood with reference to the memory system as mentioned above.

Examples of the present disclosure provide an operation method of a memory. The operation method of a memory comprises following operation: during a refresh operation on a memory cell coupled with at least one selected word line in a plurality of word lines, applying a first voltage to an unselected word line adjacent to the selected word line by turning on a first voltage transmission circuit and at least partially turning off a second voltage transmission circuit.

In some examples, the method further comprises: during a read or write operation on a memory cell coupled with one selected word line in the plurality of word lines, applying the first voltage to an unselected word line adjacent to the selected word line by turning on the first voltage transmission circuit and turning on the second voltage transmission circuit.

In some examples, the method further comprises: starting to apply a precharge voltage to the selected word line at a first timing; starting to float the selected word line at a third timing after the first timing; and applying the first voltage to the unselected word line adjacent to the selected word line in a first period before the first timing, and applying a second voltage to the unselected word line adjacent to the selected word line in a second period after the first timing and before the third timing, wherein the first voltage and the second voltage are both negative voltages, and the first voltage is less than the second voltage.

In some examples, the method further comprises: starting to apply the precharge voltage to the selected word line at the first timing, and at a second timing before the first timing, changing the voltage applied to the unselected word line adjacent to the selected word line from the second voltage to the first voltage; and starting to float the selected word line at the third timing after the first timing, and at a fourth timing before the third timing and after the first timing, changing the voltage applied to the unselected word line adjacent to the selected word line from the first voltage to the second voltage.

The operation method will be described below in connection with FIG. 8 and FIG. 10*b*. A structure of the memory may be referred to the relevant description in the above examples, which is no longer repeated here.

At the first timing T1, the precharge voltage Vpp starts to be supplied to the select word line in the plurality of word lines; at the second timing T2 before the first timing T1, the voltage supplied to the non-select word line adjacent to the select word line is changed from a second voltage VNEG1 to a first voltage VNEG2; at the third timing T3 after the first timing T1, the select word line starts to be floated; and at the fourth timing T4 before the third timing T3 and after the first timing T1, the voltage supplied to the adjacent non-select word line is changed from the first voltage VNEG2 to the second voltage VNEG1, wherein the first voltage and the second voltage are both negative voltages, and the first voltage is less than the second voltage.

In the examples of the present disclosure, the voltage supplied to the adjacent non-select word line is reduced before precharging the select word line, so as to control a final voltage to which the voltage on the adjacent non-select word line is pulled up by the coupling, which is a highest voltage resulting in a voltage change subsequently. At the same time, the voltage supplied to the adjacent non-select word line is increased before discharging the select word line, so as to control a final voltage to which the voltage on the adjacent non-select word line is pulled down by the coupling, which is a lowest voltage resulting in the voltage change subsequently. As such, the voltage change on the adjacent non-select word line may be reduced effectively during the charge-discharge process of the select word line, avoiding a change in content of the adjacent memory cell and a bit flip, thereby protecting the safety of data.

At the second timing T2, the voltage supplied to the non-select word line adjacent to the select word line changes from the second voltage VNEG1 to the first voltage VNEG2. The first voltage is applied in different manners for different access operations. In an example, during the refresh operation on the memory cells coupled with a plurality of selected word line in the plurality of word lines, the first voltage is applied to the unselected word line adjacent to the selected word line by turning on the first voltage transmission circuit and at least partially turning off the second voltage transmission circuit; and during the read or write operation on the memory cell coupled with one selected word line in the plurality of word lines, the first voltage is applied to the unselected word line adjacent to the selected word line by turning on the first voltage transmission circuit and turning on the second voltage transmission circuit.

In the examples of the present disclosure, the first voltage is applied to the unselected word line adjacent to the selected word line by turning on the first voltage transmission circuit and at least partially turning off the second voltage transmission circuit. Since the first voltage transmission circuit and the second voltage transmission circuit are both connected between the first voltage and the unselected word line, at least partially turning off the second voltage transmission circuit may reduce effective paths between the first voltage and the unselected word line, reducing current consumption at the first voltage without changing a supply source of the first voltage, and thereby reducing a refresh current during a refresh.

The upper and lower cases of voltage labels involved in the examples of the present disclosure denote the same meaning. For example, vneg1 and VNEG1 represent the same meaning, and vneg2 and VNEG2 represent the same meaning.

The methods disclosed in several method examples provided by the present disclosure may be combined randomly in the case of no conflicts, so as to obtain a new method example.

The features disclosed in several device examples provided by the present disclosure may be combined randomly in the case of no conflicts, so as to obtain a new device example.

The above descriptions are merely example implementations of the present disclosure, and the scope of protection of the present disclosure is not limited thereto. Any variations or replacements readily conceivable to a skilled person in the art fall within the technical scope of the present disclosure, and shall fall within the protection scope of the present disclosure.

What is claimed is:

1. A memory, comprising:
a plurality of word lines;
a plurality of memory cells coupled with each word line; and
a peripheral circuit coupled to the plurality of word lines and configured to:
during a refresh operation on a memory cell coupled with at least one selected word line in the plurality of word lines, apply a first voltage to an unselected word line adjacent to the selected word line by turning on a first voltage transmission circuit and at least partially turning off a second voltage transmission circuit; and
during a read or write operation on a memory cell coupled with one selected word line in the plurality of word lines, apply the first voltage to the unselected word line adjacent to the selected word line by turning on the first voltage transmission circuit and turning on the second voltage transmission circuit.

2. The memory of claim 1, wherein the peripheral circuit is further configured to:
start to apply a precharge voltage to the selected word line at a first timing;
start to float the selected word line at a third timing after the first timing;
apply the first voltage to the unselected word line adjacent to the selected word line in a first period before the first timing; and
apply a second voltage to the unselected word line adjacent to the selected word line in a second period after the first timing and before the third timing, wherein the first voltage and the second voltage are both negative voltages, and the first voltage is less than the second voltage.

3. The memory of claim 2, wherein the peripheral circuit comprises:
the first voltage transmission circuit coupled with a word-line driver circuit and configured to: apply the first voltage to the word-line driver circuit in the first period during read, write, and refresh operations;
the second voltage transmission circuit coupled with the word-line driver circuit and configured to: apply the first voltage to the word-line driver circuit in the first period during read and write operations; and discontinue applying the first voltage to the word-line driver circuit in the first period during the refresh operation;
a third voltage transmission circuit coupled with the word-line driver circuit and configured to: apply the second voltage to the word-line driver circuit in the second period during the read, write, and refresh operations; and
the word-line driver circuit configured to: during the read, write, and refresh operations, apply the received precharge voltage to the selected word line, and apply a voltage received from the first voltage transmission circuit, the second voltage transmission circuit, or the third voltage transmission circuit to the unselected word line adjacent to the selected word line.

4. The memory of claim 2, wherein the word-line driver circuit is configured to:
at a second timing before the first timing, change a voltage applied to the unselected word line adjacent to the selected word line from the second voltage to the first voltage; and
at a fourth timing before the third timing and after the first timing, change the voltage applied to the unselected word line adjacent to the selected word line from the first voltage to the second voltage.

5. The memory of claim 4, wherein the first voltage transmission circuit is configured to apply the first voltage to the word-line driver circuit at the second timing in response to a second control signal being in a valid state;

the second voltage transmission circuit is configured to apply the first voltage to the word-line driver circuit at the second timing in response to a refresh control signal being in an invalid state; and discontinue applying the first voltage to the word-line driver circuit at the second timing in response to the refresh control signal being in a valid state; and the third voltage transmission circuit is configured to apply the second voltage to the word-line driver circuit at the fourth timing in response to a first control signal being in a valid state.

6. The memory of claim 5, wherein the first voltage transmission circuit is configured to apply the first voltage to the word-line driver circuit at the second timing in response to the second control signal being in the valid state and a word line select signal being in a valid state; and wherein the second voltage transmission circuit is configured to apply the first voltage to the word-line driver circuit at the second timing in response to the refresh control signal being in the invalid state, the second control signal being in the valid state, and the word line select signal being in the valid state.

7. The memory of claim 6, wherein the third voltage transmission circuit comprises a first transistor group, and the first transistor group comprises a plurality of first transistors, each first transistor having a first end receiving the first control signal, a second end receiving the second voltage, and a third end connected with the word-line driver circuit.

8. The memory of claim 6, wherein the first voltage transmission circuit comprises a second transistor group and a third transistor group, wherein the second transistor group comprises a plurality of second transistors, each second transistor having a first end receiving the second control signal, a second end connected with a third transistor, and a third end connected with the word-line driver circuit; and the third transistor group comprises a plurality of third transistors, each third transistor having a first end receiving the word line select signal, a second end receiving the first voltage, and a third end connected with the second transistor; and the second voltage transmission circuit comprises a fourth transistor group, a fifth transistor group, and a sixth transistor group, wherein the fourth transistor group comprises a plurality of fourth transistors, each fourth transistor having a first end receiving a refresh activation signal, a second end connected with a fifth transistor, and a third end connected with the word-line driver circuit; the fifth transistor group comprises a plurality of fifth transistors, each fifth transistor having a first end receiving the second control signal, a second end connected with a sixth transistor, and a third end connected with the fourth transistor; and the sixth transistor group comprises a plurality of sixth transistors, each sixth transistor having a first end receiving the word line select signal, a second end receiving the first voltage, and a third end connected with the fifth transistor.

9. The memory of claim 8, wherein the second transistor group and the third transistor group each comprise a first number of transistors, and the fourth transistor group, the fifth transistor group, and the sixth transistor group each comprise a second number of transistors;

the plurality of second transistors, the plurality of third transistors, the plurality of fourth transistors, the plurality of fifth transistors, and the plurality of sixth transistors are each in a parallel cascade relationship; and the first number is greater than or equal to the second number.

10. The memory of claim 9, wherein a ratio of the first number to the second number ranges from 9:3 to 1:1.

11. The memory of claim 8, wherein the peripheral circuit further comprises:

a refresh control signal generation circuit coupled with the second voltage transmission circuit and configured to: receive the precharge voltage, a ground voltage, and the refresh activation signal, and generate the refresh control signal according to the refresh activation signal, wherein the refresh activation signal being in a valid state indicates performing the refresh operation on the selected word line;

a first control signal generation circuit coupled with the third voltage transmission circuit and configured to: receive the precharge voltage, the second voltage, and an enable control signal, and generate the first control signal according to the enable control signal, wherein the enable control signal being in a valid state indicates switching the word line select signal to the valid state; and a second control signal generation circuit coupled with both the first voltage transmission circuit and the second voltage transmission circuit and configured to: receive the precharge voltage, the first voltage, and the first control signal, and generate the second control signal according to the first control signal.

12. The memory of claim 4, wherein a plurality of word-line driver circuits are disposed in one-to-one correspondence with the plurality of word lines, wherein the word-line driver circuit is configured to: receive a main word line select signal, the word line select signal, and a precharge control signal, apply the received precharge voltage to the selected word line between the first timing and the third timing, apply the first voltage to the unselected word line adjacent to the selected word line between the second timing and the fourth timing, and apply the second voltage to the unselected word line adjacent to the selected word line before the second timing and after the fourth timing;

wherein the main word line select signal being in a valid state indicates selecting one of a plurality of main word lines of the peripheral circuit, each main word line corresponding to a plurality of word lines; the word line select signal being in a valid state indicates selecting one of the plurality of word lines corresponding to the main word line; and the precharge control signal being in a valid state indicates applying the precharge voltage to the selected word line.

13. The memory of claim 12, wherein the peripheral circuit further comprises:

a first voltage generator coupled with the first voltage transmission circuit and the second voltage transmission circuit and configured to generate the first voltage; and a second voltage generator coupled with the third voltage transmission circuit and configured to generate the second voltage.

14. The memory of claim 13, wherein the plurality of word-line driver circuits are divided into a plurality of groups, each group of word-line driver circuits corresponding to one first voltage generator, one second voltage generator, one first voltage transmission circuit, one second voltage transmission circuit, and one third voltage transmission circuit.

15. A memory, comprising:

a plurality of word lines;

a plurality of memory cells coupled with each word line; and a peripheral circuit coupled to the plurality of word lines, the peripheral circuit comprising a first voltage generator, a second voltage generator, a first voltage transmission circuit, a second voltage transmission circuit, a third voltage transmission circuit, and a plurality of word-line driver circuits, wherein the first voltage transmission circuit and the second voltage transmission circuit are connected in parallel between the first voltage generator and the plurality of word-line driver circuits, the third voltage transmission circuit is connected between the second voltage generator and the plurality of word-line driver circuits, and the plurality of word-line driver circuits are coupled with the plurality of word lines.

16. An operation method of a memory, comprising:

during a refresh operation on a memory cell coupled with at least one selected word line in a plurality of word lines, applying a first voltage to an unselected word line adjacent to the selected word line by turning on a first voltage transmission circuit and at least partially turning off a second voltage transmission circuit; and during a read or write operation on a memory cell coupled with one selected word line in the plurality of word lines, applying the first voltage to the unselected word line adjacent to the selected word line by turning on the first voltage transmission circuit and turning on the second voltage transmission circuit.

17. The operation method of a memory of claim 16, further comprising:

starting to apply a precharge voltage to the selected word line at a first timing;

starting to float the selected word line at a third timing after the first timing; and applying the first voltage to the unselected word line adjacent to the selected word line in a first period before the first timing, and applying a second voltage to the unselected word line adjacent to the selected word line in a second period after the first timing and before the third timing, wherein the first voltage and the second voltage are both negative voltages, and the first voltage is less than the second voltage.

18. The operation method of a memory of claim 17, further comprising:

starting to apply the precharge voltage to the selected word line at the first timing, and at a second timing before the first timing, changing a voltage applied to the unselected word line adjacent to the selected word line from the second voltage to the first voltage; and starting to float the selected word line at the third timing after the first timing, and at a fourth timing before the third timing and after the first timing, changing the voltage applied to the unselected word line adjacent to the selected word line from the first voltage to the second voltage.

* * * * *